United States Patent
Nonomura et al.

(10) Patent No.: US 12,371,788 B2
(45) Date of Patent: Jul. 29, 2025

(54) METHOD OF MANUFACTURING SEMICONDUCTOR DEVICE, SUBSTRATE PROCESSING APPARATUS AND NON-TRANSITORY COMPUTER-READABLE RECORDING MEDIUM

(71) Applicant: Kokusai Electric Corporation, Tokyo (JP)

(72) Inventors: Kazuki Nonomura, Toyama (JP); Yuji Takebayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 422 days.

(21) Appl. No.: 17/477,170

(22) Filed: Sep. 16, 2021

(65) Prior Publication Data

US 2022/0002873 A1  Jan. 6, 2022

Related U.S. Application Data

(63) Continuation of application No. PCT/JP2019/012442, filed on Mar. 25, 2019.

(51) Int. Cl.
| | |
|---|---|
| C23C 16/455 | (2006.01) |
| C23C 16/452 | (2006.01) |
| H01L 21/673 | (2006.01) |

(52) U.S. Cl.
CPC ...... *C23C 16/45578* (2013.01); *C23C 16/452* (2013.01); *C23C 16/45557* (2013.01); *H01L 21/67346* (2013.01)

(58) Field of Classification Search
CPC ........ C23C 16/45557; C23C 16/45502; C23C 16/45546; C23C 16/45578
See application file for complete search history.

(56) References Cited

U.S. PATENT DOCUMENTS

| | | |
|---|---|---|
| 8,652,258 B2 | 2/2014 | Yokogawa et al. |
| 8,808,455 B2 | 8/2014 | Saito et al. |

(Continued)

FOREIGN PATENT DOCUMENTS

| | | |
|---|---|---|
| JP | H06-228757 A | 8/1994 |
| JP | 44-64949 B2 | 5/2010 |

(Continued)

OTHER PUBLICATIONS

Japanese Office Action issued on Jul. 11, 2022 for Japanese Patent Application No. 2021-508410.

(Continued)

*Primary Examiner* — Joseph A Miller, Jr.
(74) *Attorney, Agent, or Firm* — Volpe Koenig

(57) ABSTRACT

According to one aspect of the present disclosure, there is provided a technique including: (a) stacking and accommodating substrates in a process chamber; (b) supplying a source gas to the plurality of substrates through a first nozzle provided in the process chamber along a stacking direction of the plurality of substrates and a second nozzle provided in the process chamber along the stacking direction of the plurality of substrates, wherein an amount of the source gas supplied through an upper portion of the first nozzle is greater than that of the source gas supplied through a lower portion of the first nozzle, and an amount of the source gas supplied through the lower portion of the second nozzle is greater than that of the source gas supplied through the upper portion of the second nozzle; and (c) supplying a reactive gas to the substrates.

12 Claims, 12 Drawing Sheets

(56) References Cited

U.S. PATENT DOCUMENTS

| | | | |
|---|---|---|---|
| 2012/0214300 A1* | 8/2012 | Kaga | H01L 21/0228 438/597 |
| 2014/0357058 A1* | 12/2014 | Takagi | C23C 16/45534 118/724 |
| 2017/0067159 A1 | 3/2017 | Isobe et al. | |
| 2017/0232457 A1 | 8/2017 | Fujino et al. | |

FOREIGN PATENT DOCUMENTS

| | | |
|---|---|---|
| JP | 2011-071412 A | 4/2011 |
| JP | 2014-063959 A | 4/2014 |
| JP | 56-10438 B2 | 10/2014 |
| JP | 2014-236129 A | 12/2014 |
| JP | 60-84298 B | 2/2017 |
| JP | 60-95825 B | 2/2017 |
| JP | 2017-054925 A | 3/2017 |
| JP | 2017-147262 A | 8/2017 |

OTHER PUBLICATIONS

ISA State Intellectual Property Office of the People's Republic of China, Second Office Action of the International Searching Authority Issued on Apr. 4, 2024 for Chinese Patent Application No. 201980094512.X.

\* cited by examiner

METHOD OF MANUFACTURING SEMICONDUCTOR DEVICE, SUBSTRATE PROCESSING APPARATUS AND NON-TRANSITORY COMPUTER-READABLE RECORDING MEDIUM

CROSS-REFERENCE TO RELATED PATENT APPLICATION

This application is a Bypass continuation application of PCT International Application No. PCT/JP2019/012442, filed on Mar. 25, 2019, in the WIPO, the entire contents of which are hereby incorporated by reference.

FIELD

The present disclosure relates to a method of manufacturing a semiconductor device, a substrate processing apparatus and a non-transitory computer-readable recording medium.

RELATED ART

In a substrate processing apparatus such as a vertical type film-forming apparatus, when a film is formed by supplying a gas to a plurality of substrates accommodated in a boat using a multi-hole nozzle (porous nozzle), a thickness of the film on a substrate located at an upper portion of the boat may be different from a thickness of the film on a substrate located at a lower portion of the boat. As a result, a thickness uniformity of the film between the plurality of substrates stacked (accommodated) in the boat may deteriorate.

SUMMARY

Described herein is a technique capable of adjusting a thickness balance of a film between a plurality of substrates stacked in a process chamber.

According to one aspect of the technique of the present disclosure, there is provided a technique including: (a) stacking and accommodating a plurality of substrates in a process chamber; (b) supplying a source gas to the plurality of substrates through a first nozzle provided in the process chamber along a stacking direction of the plurality of substrates and a second nozzle provided in the process chamber along the stacking direction of the plurality of substrates, wherein an amount of the source gas supplied through an upper portion of the first nozzle is greater than that of the source gas supplied through a lower portion of the first nozzle, and an amount of the source gas supplied through the lower portion of the second nozzle is greater than that of the source gas supplied through the upper portion of the second nozzle; and (c) supplying a reactive gas to the plurality of substrates.

DETAILED DESCRIPTION

Figure 1:
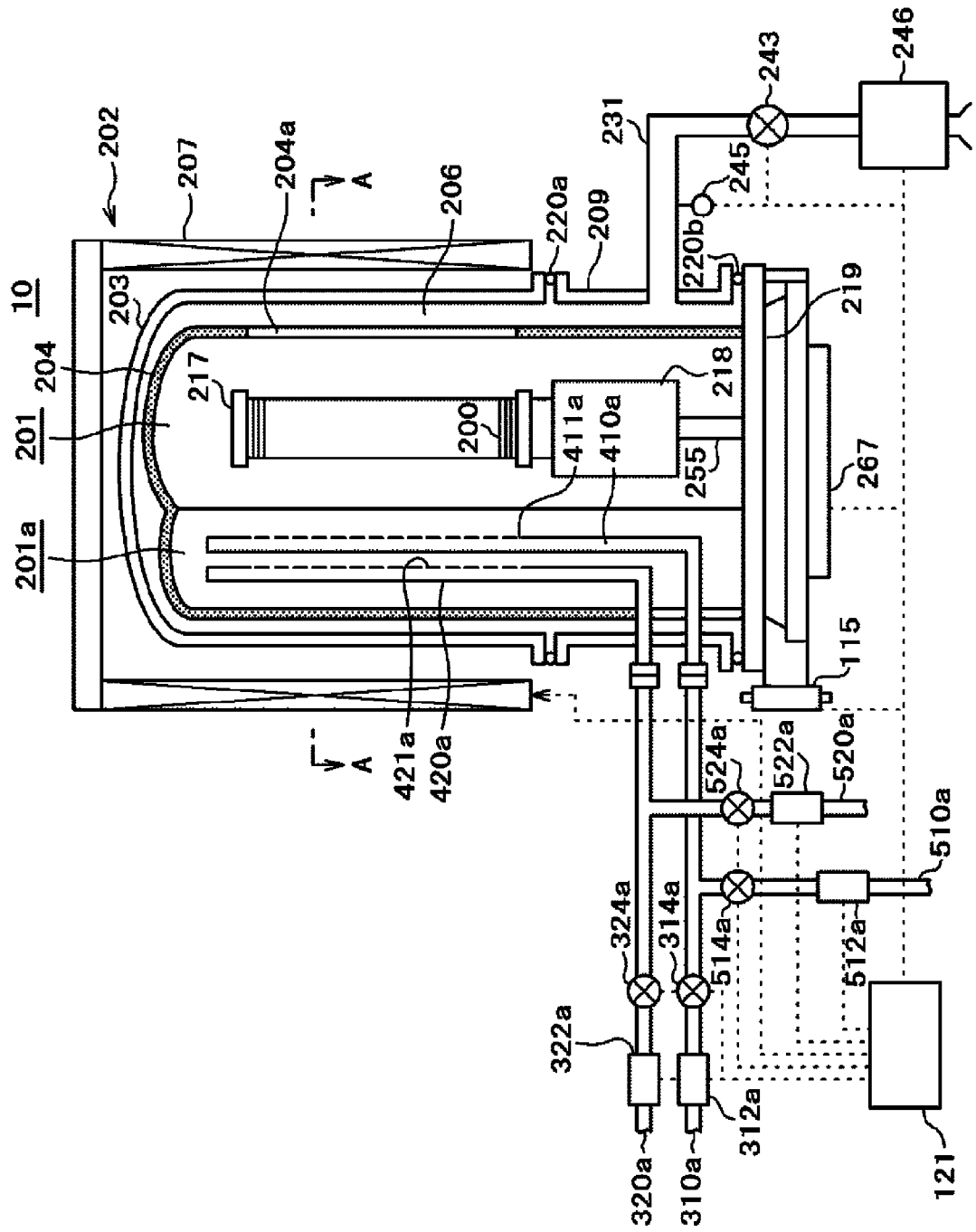
FIG. 1 is a diagram schematically illustrating a vertical cross-section of a vertical type process furnace of a substrate processing apparatus according to a first embodiment described herein.

Hereinafter, embodiments according to the technique of the present disclosure will be described with reference to the drawings.

First Embodiment

Hereinafter, a first embodiment according to the technique of the present disclosure will be described with reference to FIG. 1 through FIG. 7. A substrate processing apparatus 10 is an example of an apparatus used in a manufacturing process of a semiconductor device.

(1) Configuration of Substrate Processing Apparatus

The substrate processing apparatus 10 includes a process furnace 202. The process furnace 202 is provided with a heater 207 serving as a heating apparatus (which is a heating structure or a heating system). The heater 207 is of a cylindrical shape, and is vertically installed while being supported by a heater base (not shown) serving as a support plate.

An outer tube 203 constituting a reaction vessel (which is a process vessel) is provided in an inner side of the heater 207 to be aligned in a manner concentric with the heater 207. For example, the outer tube 203 is made of a heat resistant material such as quartz ($SiO_2$) and silicon carbide (SiC). For example, the outer tube 203 is of a cylindrical shape with a closed upper end and an open lower end. A manifold (which is an inlet flange) 209 is provided under the outer tube 203 to be aligned in a manner concentric with the outer tube 203.

For example, the manifold 209 is made of a metal such as stainless steel (SUS). The manifold 209 is of a cylindrical shape with open upper and lower ends. An O-ring 220a serving as a seal is provided between the upper end of the manifold 209 and the outer tube 203. As the manifold 209 is supported by the heater base (not shown), the outer tube 203 is installed vertically.

An inner tube 204 constituting the reaction vessel is provided in an inner side of the outer tube 203. For example, the inner tube 204 is made of a heat resistant material such as quartz ($SiO_2$) and silicon carbide (SiC). For example, the inner tube 204 is of a cylindrical shape with a closed upper end and an open lower end. The process vessel (reaction vessel) is constituted mainly by the outer tube 203, the inner tube 204 and the manifold 209. A process chamber 201 is provided in (or defined by) a hollow cylindrical portion of the process vessel (that is, an inner side of the inner tube 204).

Figure 5:
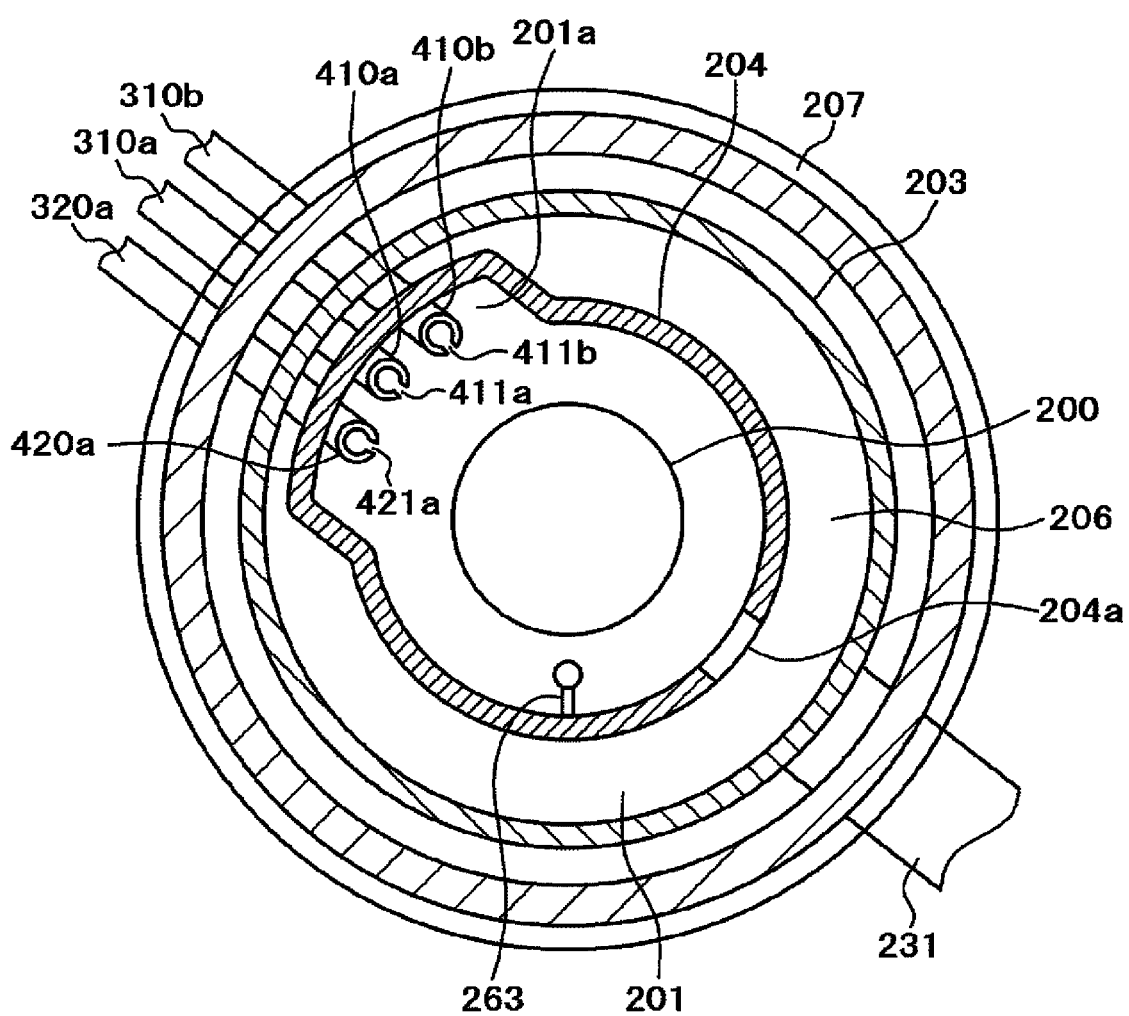
FIG. 5 is a diagram schematically illustrating a cross-section of the vertical type process furnace of the substrate processing apparatus taken along the line A-A of FIG. 1.

The process chamber 201 is configured to stack and accommodate a plurality of wafers including a wafer 200 serving as a substrate in a horizontal orientation in a multistage manner along a vertical direction by a boat 217 described later. Hereinafter, the plurality of wafers including the wafer 200 may also be simply referred to as wafers 200. As shown in FIG. 5, a nozzle 410a (also referred to as a "first nozzle"), a nozzle 410b (also referred to as a "second nozzle") and a nozzle 420a (also referred to as a "third nozzle") are installed in the process chamber 201 so as to penetrate a side wall of the manifold 209 and the inner tube 204. Gas supply pipes 310a, 310b and 320a serving as gas supply lines are connected to the nozzles 410a, 410b and 420a, respectively. As described above, the three nozzles 410a, 410b and 420a and the three gas supply pipes 310a, 310b and 320a are provided in the substrate processing apparatus 10, and it is possible to supply various gases into the process chamber 201 through the three nozzles 410a, 410b and 420a and the three gas supply pipes 310a, 310b and 320a. However, the process furnace 202 of the present embodiment is not limited to the example described above.

Figure 2:
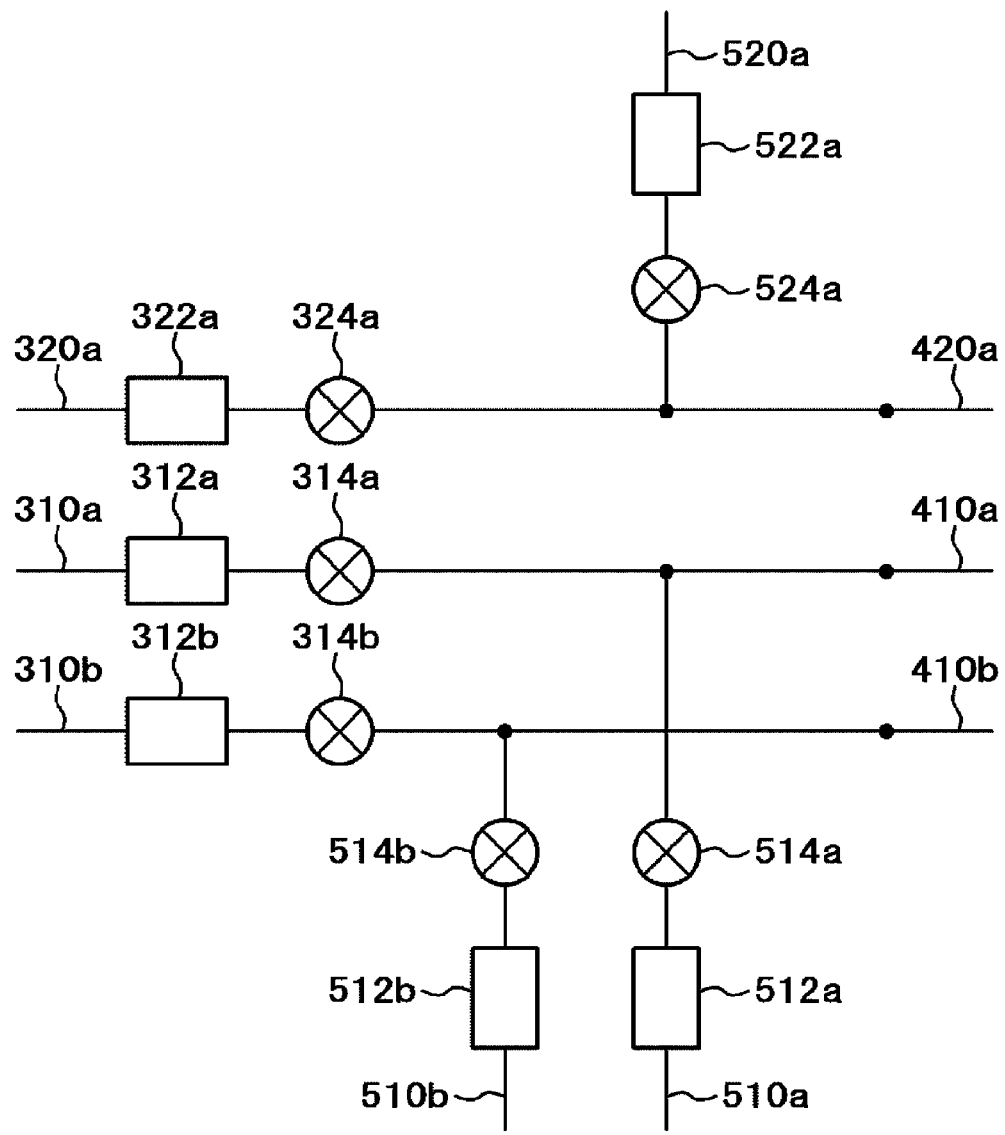
FIG. 2 is a diagram schematically illustrating a gas supplier of the substrate processing apparatus according to the first embodiment described herein.

As shown in FIGS. 1 and 2, mass flow controllers (MFCs) 312a, 312b and 322a serving as flow rate controllers (flow rate control structures) and valves 314a, 314b and 324a serving as opening/closing valves are sequentially installed at the gas supply pipes 310a, 310b and 320a in this order from upstream sides to downstream sides of the gas supply pipes 310a, 310b and 320a, respectively. Gas supply pipes 510a, 510b and 520a through which an inert gas is supplied are connected to the gas supply pipes 310a, 310b and 320a at downstream sides of the valves 314a, 314b and 324a, respectively. MFCs 512a, 512b and 522a and valves 514a, 514b and 524a are sequentially installed at the gas supply pipes 510a, 510b and 520a in this order from upstream sides to downstream sides of the gas supply pipes 510a, 510b and 520a, respectively.

The nozzles 410a, 410b and 420a are connected to front ends (tips) of the gas supply pipes 310a, 310b and 320a, respectively. Each of the nozzles 410a, 410b and 420a may include an L-shaped nozzle. Horizontal portions of the nozzles 410a, 410b and 420a are installed so as to penetrate the side wall of the manifold 209 and the inner tube 204. Vertical portions of the nozzles 410a, 410b and 420a are installed in a spare chamber 201a of a channel shape (a groove shape) protruding outward in a radial direction of the inner tube 204 and extending in the vertical direction. That is, the vertical portions of the nozzles 410a, 410b and 420a are installed in the spare chamber 201a toward an upper portion of the inner tube 204 (in a direction in which the wafers 200 are arranged) and along an inner wall of the inner tube 204.

The nozzles 410a, 410b and 420a extend from a lower region of the process chamber 201 to an upper region of the process chamber 201. The nozzles 410a, 410b and 420a are provided with a plurality of gas supply holes (which are gas supply ports) 411a, a plurality of gas supply holes (which are gas supply ports) 411b and a plurality of gas supply holes (which are gas supply ports) 421a facing the wafers 200, respectively. Thereby, a gas such as a process gas can be supplied to the wafers 200 through the plurality of gas supply holes 411a of the nozzle 410a, the plurality of gas supply holes 411b of the nozzle 410b and the plurality of gas supply holes 421a of the nozzle 420a. The plurality of gas supply holes 421a are provided from a lower portion to the upper portion of the inner tube 204. An opening area of each of the gas supply holes 421a is the same, and each of the gas supply holes 421a is provided at the same pitch. However, the plurality of gas supply holes 421a are not limited thereto. For example, the opening area of each of the gas supply holes 421a may gradually increase from the lower portion to the upper portion of the inner tube 204 to further uniformize a flow rate of the gas supplied through the plurality of gas supply holes 421a. A configuration of the plurality of gas supply holes 411a of the nozzle 410a will be described in detail below with reference to FIG. 3, and a configuration of the plurality of gas supply holes 411b of the nozzle 410b will be described in detail with reference to FIG. 4.

In the present specification, a lower portion (upstream side) of each of the nozzles 410a, 410b and 420a refers to: a lower side of each of the nozzles 410a, 410b and 420a provided in the process chamber 201 and vertically extending along a stacking direction of the wafers 200 (also referred to as a "substrate stacking direction"); a region of each of the nozzles 410a, 410b and 420a closer to a supply source of the process gas; or an upstream side of a flow of the process gas in each of the nozzles 410a, 410b and 420a. Further, an upper portion (downstream side) of each of the nozzles 410a, 410b and 420a refers to: an upper side of each of the nozzles 410a, 410b and 420a provided in the process chamber 201 and vertically extending along the stacking direction of the wafers 200; or a downstream side of the flow of the process gas in each of the nozzles 410a, 410b and 420a.

The plurality of gas supply holes 411a of the nozzle 410a are provided from the lower portion (that is, the upstream side) to the upper portion (that is, the downstream side) thereof at positions facing the wafers 200. Among the plurality of gas supply holes 411a in the nozzle 410a, a hole diameter $\phi$ (opening area) of a gas supply hole provided in the lower portion (upstream side) of the nozzle 410a is smaller than a hole diameter $\phi$ (opening area) of a gas supply hole provided in the upper portion (downstream side) of the nozzle 410a. That is, the hole diameter $\phi$ of each of the gas supply holes 411a provided in the nozzle 410a increases along a direction from the upstream side to the downstream side of the nozzle 410a. In other words, the opening area of each of the gas supply holes 411a provided in the nozzle 410a increases along the direction from the upstream side to the downstream side of the nozzle 410a. Hereinafter, a gas supply hole or gas supply holes among the plurality of gas supply holes 411a may also be referred to as a gas supply hole 411a or gas supply holes 411a.

Let Y be a region where the plurality of gas supply holes 411a of the nozzle 410a are located. Then, the region Y can be divided into regions, which are a first region Y(1), a second region Y(2), a third region Y(3), . . . , an $(n-1)^{th}$ region Y(n−1) and an $n^{th}$ region Y(n), from the lower portion (upstream side) to the upper portion (downstream side) of the nozzle 410a. Z(1) number of the gas supply holes 411a with the hole diameter ϕ of A(1) mm and the pitch of X mm are located in the first region Y(1). Z(2) number of the gas supply holes 411a with the hole diameter ϕ of A(2) mm and the pitch of X mm are located in the second region Y(2). Z(3) number of the gas supply holes 411a with the hole diameter ϕ of A(3) mm and the pitch of X mm are located in the third region Y(3). Similarly, Z(n−1) number of the gas supply holes 411a with the hole diameter ϕ of A(n−1) mm and the pitch of X mm are located in the $(n-1)^{th}$ region Y(n−1). Z(n) number of the gas supply holes 411a with the hole diameter ϕ of A(n) mm and the pitch of X mm are located in the $n^{th}$ region Y(n).

A relation between the hole diameters ϕ of the gas supply holes 411a in each of the regions Y(1) through Y(n) can be represented as follows:

$$\phi: A(n) > A(1), A(2), A(3), \ldots, A(n-1)$$

For example, when an absolute value of the hole diameter ϕ may range from 0.5 mm to 3.0 mm, a relative ratio of A(1) to A(n) may range from 1:1.01 to 1:6. The hole diameter ϕ of each of gas supply holes 411a is set such that the flow rate of the gas supplied through the plurality of gas supply holes 411a increases from the upstream side to the downstream side of the nozzle 410a.

The plurality of gas supply holes 411b of the nozzle 410b are provided from the lower portion (that is, the upstream side) to the upper portion (that is, the downstream side) thereof at positions facing the wafers 200. Among the plurality of gas supply holes 411b in the nozzle 410b, a hole diameter ϕ (opening area) of a gas supply hole provided in the lower portion (upstream side) of the nozzle 410b is greater than a hole diameter ϕ (opening area) of a gas supply hole provided in the upper portion (downstream side) of the nozzle 410b. That is, the hole diameter ϕ of each of the gas supply holes 411b provided in the nozzle 410b decreases along a direction from the upstream side to the downstream side of the nozzle 410b. In other words, the opening area of each of the gas supply holes 411b provided in the nozzle 410b increases along a direction from the downstream side to the upstream side of the nozzle 410b. Hereinafter, a gas supply hole or gas supply holes among the plurality of gas supply holes 411b may also be referred to as a gas supply hole 411b or gas supply holes 411b.

Let Y be a region where the plurality of gas supply holes 411b of the nozzle 410b are located. Then, the region Y can be divided into regions, which are a first region Y(1), a second region Y(2), a third region Y(3), . . . , an $(n-1)^{th}$ region Y(n−1) and an $n^{th}$ region Y(n), from the lower portion (upstream side) to the upper portion (downstream side) of the nozzle 410b. Z(1) number of the gas supply holes 411b with the hole diameter ϕ of B(1) mm and the pitch of X mm are located in the first region Y(1). Z(2) number of the gas supply holes 411b with the hole diameter ϕ of B(2) mm and the pitch of X mm are located in the second region Y(2). Z(3) number of the gas supply holes 411b with the hole diameter ϕ of B(3) mm and the pitch of X mm are located in the third region Y(3). Similarly, Z(n−1) number of the gas supply holes 411b with the hole diameter ϕ of B(n−1) mm and the pitch of X mm are located in the $(n-1)^{th}$ region Y(n−1). Z(n) number of the gas supply holes 411b with the hole diameter ϕ of B(n) mm and the pitch of X mm are located in the $n^{th}$ region Y(n).

A relation between the hole diameters ϕ of the gas supply holes 411b in each of the regions Y(1) through Y(n) can be represented as follows:

$$\phi: B(1) > B(2), B(3), \ldots, B(n-1), B(n)$$

For example, when an absolute value of the hole diameter ϕ may range from 0.5 mm to 3.0 mm, a relative ratio of B(n) to B(1) may range from 1:1.01 to 1:6. The hole diameter ϕ of each of gas supply holes 411b is set such that the flow rate of the gas supplied through the plurality of gas supply holes 411b increases from the downstream side to the upstream side of the nozzle 410b.

With such a configuration, by adjusting a flow rate of the process gas supplied into the process chamber 201 through the plurality of gas supply holes 411a of the nozzle 410a and the plurality of gas supply holes 411b of the nozzle 410b, it is possible to adjust a partial pressure balance of the process gas in the process chamber 201 to follow a desired value of the partial pressure balance. In the present embodiment, a distribution of the partial pressure in the stacking direction of the wafers 200 is mainly referred to as the partial pressure balance in the process chamber 201.

The plurality of gas supply holes 411a of the nozzle 410a, the plurality of gas supply holes 411b of the nozzle 410b and the plurality of gas supply holes 421a of the nozzle 420a are provided from a lower portion to an upper portion of the boat 217 described later. Therefore, the process gas supplied into the process chamber 201 through the plurality of gas supply holes 411a, the plurality of gas supply holes 411b and the plurality of gas supply holes 421a of the nozzles 410a, 410b and 420a is supplied onto the wafers 200 accommodated in the boat 217 from the lower portion to the upper portion thereof, that is, the entirety of the wafers 200 accommodated in the boat 217. It is preferable that the nozzles 410a, 410b and 420a extend from the lower region to the upper region of the process chamber 201. However, the nozzles 410a, 410b and 420a may extend to the vicinity of a ceiling of the boat 217.

A source gas containing a first metal element (which is a first metal-containing gas or a first source gas) serving as the process gas is supplied into the process chamber 201 through the gas supply pipes 310a and 310b provided with the MFCs 312a and 312b and the valves 314a and 314b, respectively, and the nozzles 410a and 410b. As the source gas, for example, a halogen-based source (which is a halide or a halogen-based titanium source) gas such as titanium tetrachloride ($TiCl_4$) gas containing titanium (Ti) as the first metal element may be used.

A reactive gas whose molecular structure (chemical structure) is different from that of the source gas and serving as the process gas is supplied into the process chamber 201 through the gas supply pipe 320a provided with the MFC 322a and the valve 324a and the nozzle 420a. As the reactive gas, for example, a nitrogen-containing gas containing nitrogen (N) may be used. For example, ammonia ($NH_3$) gas may be used as the nitrogen-containing gas. The $NH_3$ gas serves as a nitriding and reducing agent (nitriding and reducing gas).

The inert gas such as nitrogen ($N_2$) gas is supplied into the process chamber 201 through the gas supply pipes 510a, 510b and 520a provided with the MFCs 512a, 512b and 522a and the valves 514a, 514b and 524a, respectively, and the nozzles 410a, 410b and 420a. While the present embodiment will be described by way of an example in which the $N_2$ gas is used as the inert gas, the inert gas according to the present embodiment is not limited thereto. For example, instead of the $N_2$ gas, a rare gas such as argon (Ar) gas, helium (He) gas, neon (Ne) gas and xenon (Xe) gas may be used as the inert gas.

A process gas supplier (which is a process gas supply structure or a process gas supply system) is constituted mainly by the gas supply pipes 310a, 310b and 320a, the MFCs 312a, 312b and 322a, the valves 314a, 314b and 324a and the nozzles 410a, 410b and 420a. However, only the nozzles 410a, 410b and 420a may be considered as the process gas supplier. The process gas supplier may also be simply referred to as a "gas supplier" (which is a gas supply structure or a gas supply system). When the source gas is supplied through the gas supply pipes 310a and 310b, a source gas supplier (which is a source gas supply structure or a source gas supply system) is constituted mainly by the gas supply pipes 310a and 310b, the MFCs 312a and 312b and the valves 314a and 314b. The source gas supplier may further include the nozzles 410a and 410b. The source gas supplier may also be referred to as a "source supplier" (which is a source supply structure or a source supply system). When a metal-containing gas is used as the source gas, the source gas supplier may also be referred to as a "metal-containing source gas supplier" (which is a metal-containing source gas supply structure or a metal-containing source gas supply system). When the reactive gas is supplied through the gas supply pipe 320a, a reactive gas supplier (which is a reactive gas supply structure or a reactive gas supply system) is constituted mainly by the gas supply pipe 320a, the MFC 322a and the valve 324a. The reactive gas supplier may further include the nozzle 420a. When the nitrogen-containing gas serving as the reactive gas is supplied through the gas supply pipe 320a, the reactive gas supplier may also be referred to as a "nitrogen-containing gas supplier" (which is a nitrogen-containing gas supply structure or a nitrogen-containing gas supply system). An inert gas supplier (which is an inert gas supply structure or an inert gas supply system) is constituted mainly by the gas supply pipes 510a, 510b and 520a, the MFCs 512a, 512b and 522a and the valves 514a, 514b and 524a. The inert gas supplier may also be referred to as a purge gas supplier (which is a purge gas supply structure or a purge gas supply system), a dilution gas supplier (which is a dilution gas supply structure or a dilution gas supply system), or a carrier gas supplier (which is a carrier gas supply structure or a carrier gas supply system).

According to the present embodiment, the gas is supplied through the nozzles 410a, 410b and 420a provided in a vertically long annular space which is defined by the inner wall of the inner tube 204 and edges (peripheries) of the wafers 200, that is, a cylindrical space in the spare chamber 201a. Then, the gas is ejected into the inner tube 204 through the plurality of gas supply holes 411a of the nozzle 410a, the plurality of gas supply holes 411b of the nozzle 410b and the plurality of gas supply holes 421a of the nozzle 420a facing the wafers 200. Specifically, the process gas such as the source gas is ejected into the inner tube 204 in a direction parallel to surfaces of the wafers 200 (that is, in a horizontal direction) through the plurality of gas supply holes 411a of the nozzle 410a, the plurality of gas supply holes 411b of the nozzle 410b and the plurality of gas supply holes 421a of the nozzle 420a.

An exhaust hole (exhaust port) 204a is a through-hole facing the nozzles 410a, 410b and 420a, and is provided at a side wall of the inner tube 204. That is, the exhaust hole 204a is provided at a location opposite to the spare chamber 201a by 180°. For example, the exhaust hole 204a may be of a narrow slit-shaped through-hole elongating vertically.

The gas supplied into the process chamber 201 through the plurality of gas supply holes 411a of the nozzle 410a, the plurality of gas supply holes 411b of the nozzle 410b and the plurality of gas supply holes 421a of the nozzle 420a flows over the surfaces of the wafers 200. Then, the gas that has flowed over the surfaces of the wafers 200 (that is, a residual gas) is exhausted through the exhaust hole 204a into a gap (that is, an exhaust path 206) provided between the inner tube 204 and the outer tube 203. The gas flowing in the exhaust path 206 flows into an exhaust pipe 231 and is then discharged (exhausted) out of the process furnace 202.

The exhaust hole 204a is provided at a location facing the wafers 200 (preferably, at a location facing the upper portion through the lower portion of the boat 217). The gas supplied in the vicinity of the wafers 200 in the process chamber 201 through the plurality of gas supply holes 411a, the plurality of gas supply holes 411b and the plurality of gas supply holes 421a flows in the horizontal direction (that is, in the direction parallel to the surfaces of the wafers 200). The gas that has flowed in the horizontal direction is exhausted through the exhaust hole 204a into the exhaust path 206. That is, the gas remaining in the process chamber 201 (residual gas) is exhausted in parallel with main surfaces of the wafers 200 through the exhaust hole 204a. The exhaust hole 204a is not limited to the slit-shaped through-hole. For example, the exhaust hole 204a may be configured as a plurality of holes.

The exhaust pipe 231 through which an inner atmosphere of the process chamber 201 is exhausted is installed at the manifold 209. A pressure sensor 245 serving as a pressure detector (pressure detecting structure) configured to detect an inner pressure of the process chamber 201, an APC (Automatic Pressure Controller) valve 243 and a vacuum pump 246 serving as a vacuum exhaust apparatus are sequentially connected to the exhaust pipe 231 in order from an upstream side to a downstream side of the exhaust pipe 231. With the vacuum pump 246 in operation, the APC valve 243 may be opened or closed to perform a vacuum exhaust of the process chamber 201 or stop the vacuum exhaust. With the vacuum pump 246 in operation, an opening degree of the APC valve 243 may be adjusted in order to adjust the inner pressure of the process chamber 201. An exhauster (which is an exhaust structure, an exhaust system or an exhaust line) is constituted mainly by the exhaust hole 204a, the exhaust path 206, the exhaust pipe 231, the APC valve 243 and the pressure sensor 245. The exhauster may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. For example, the seal cap 219 is made of a metal such as SUS, and is of a disk shape. An O-ring 220b serving as a seal is provided on an upper surface of the seal cap 219 so as to be in contact with the lower end of the manifold 209. A rotator 267 configured to rotate the boat 217 accommodating the wafers 200 is provided at the seal cap 219 opposite to the process chamber 201. A rotating shaft 255 of the rotator 267 is connected to the boat 217 through the seal cap 219. As the rotator 267 rotates the boat 217, the wafers 200 are rotated. The seal cap 219 may be elevated or lowered in the vertical direction by a boat elevator 115 serving as an elevator vertically provided outside the outer tube 203. When the seal cap 219 is elevated or lowered in the vertical direction by the boat elevator 115, the boat 217 may be transferred (loaded) into the process chamber 201 or transferred (unloaded) out of the process chamber 201. The boat elevator 115 serves as a transfer device (which is a transfer structure or a transfer system) that loads the boat 217 and the wafers 200 accommodated in the boat 217 into the process chamber 201 or unloads the boat 217 and the wafers 200 accommodated in the boat 217 out of the process chamber 201.

The boat 217 serving as a substrate retainer is configured to accommodate (support) the wafers 200 (for example, 25 to 200 wafers) while the wafers 200 are horizontally oriented with their centers aligned with each other with a predetermined interval therebetween in a multistage manner. For example, the boat 217 is made of a heat resistant material such as quartz and SiC. An insulating plate 218 horizontally oriented is provided under the boat 217 in a multistage manner (not shown). The insulating plate 218 is made of a heat resistant material such as quartz and SiC. With such a configuration, the insulating plate 218 suppresses the transmission of the heat from the heater 207 to the seal cap 219. However, the present embodiment is not limited thereto. For example, instead of the insulating plate 218, a heat insulating cylinder (not shown) such as a cylinder made of a heat resistant material such as quartz and SiC may be provided under the boat 217.

As shown in FIG. 5, a temperature sensor 263 serving as a temperature detector is installed in the inner tube 204. An amount of the current supplied to the heater 207 is adjusted based on temperature information detected by the temperature sensor 263 such that a desired temperature distribution of an inner temperature of the process chamber 201 can be obtained. Similar to the nozzles 410a, 410b and 420a, the temperature sensor 263 is L-shaped, and is provided along the inner wall of the inner tube 204.

Figure 6:
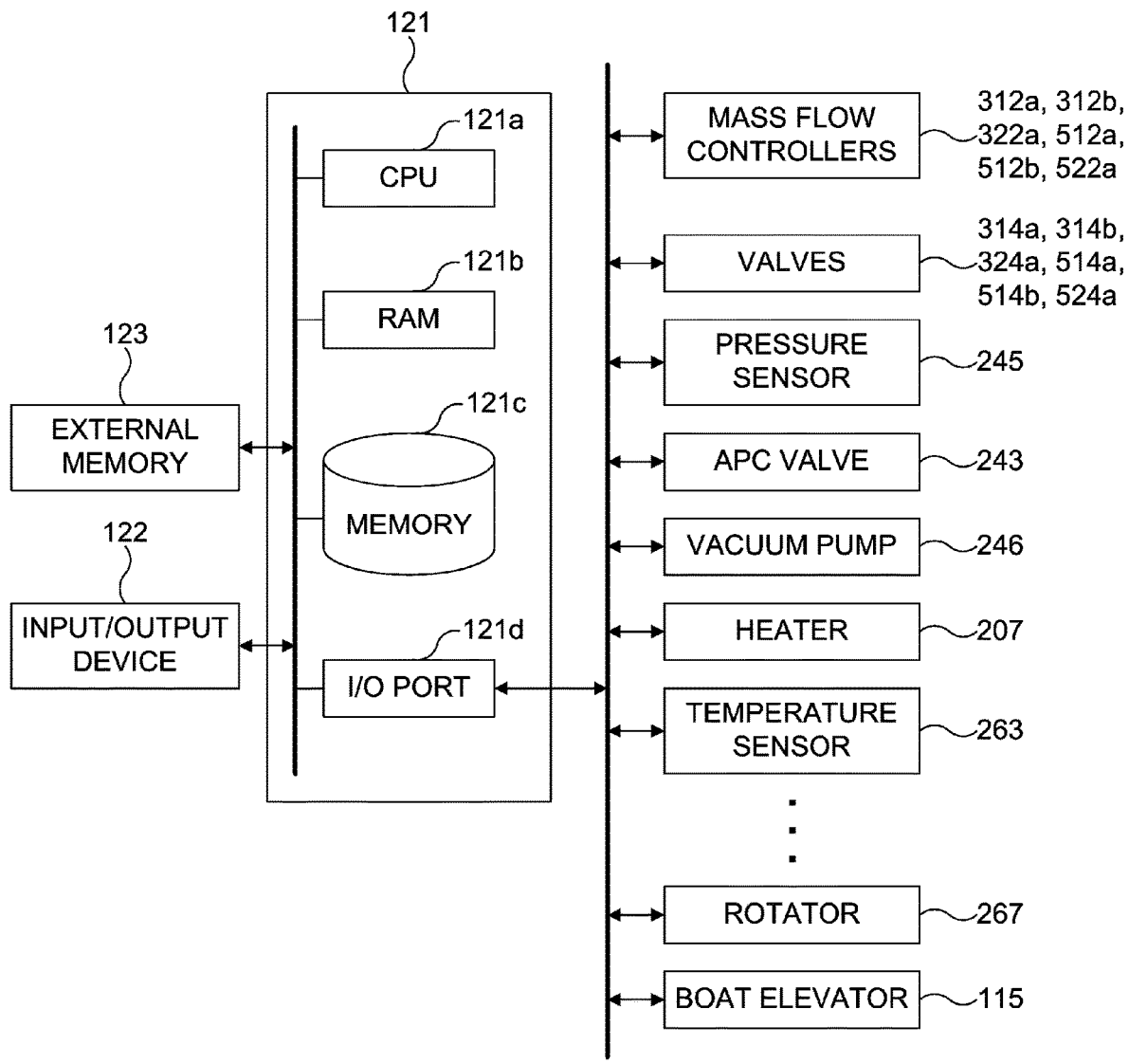
FIG. 6 is a block diagram schematically illustrating a configuration of a controller and related components of the substrate processing apparatus according to the first embodiment described herein.

As shown in FIG. 6, a controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus. For example, an input/output device 122 such as a touch panel is connected to the controller 121.

The memory 121c is configured by a component such as a flash memory and a hard disk drive (HDD). For example, a control program configured to control the operation of the substrate processing apparatus 10 or a process recipe containing information on the sequences and conditions of a method of manufacturing a semiconductor device described later is readably stored in the memory 121c. The process recipe is obtained by combining steps of the method of manufacturing the semiconductor device described later such that the controller 121 can execute the steps to acquire a predetermined result, and functions as a program. Hereafter, the process recipe and the control program may be collectively or individually referred to as a "program". In the present specification, the term "program" may refer to the process recipe alone, may refer to the control program alone, or may refer to a combination of the process recipe and the control program. The RAM 121b functions as a memory area (work area) where a program or data read by the CPU 121a is temporarily stored.

The I/O port 121d is connected to the above-described components such as the MFCs 312a, 312b, 322a, 512a, 512b and 522a, the valves 314a, 314b, 324a, 514a, 514b and 524a, the pressure sensor 245, the APC valve 243, the vacuum pump 246, the heater 207, the temperature sensor 263, the rotator 267 and the boat elevator 115.

The CPU 121a is configured to read the control program from the memory 121c and execute the read control program. In addition, the CPU 121a is configured to read a recipe such as the process recipe from the memory 121c in accordance with an operation command inputted from the input/output device 122. According to the contents of the read recipe, the CPU 121a may be configured to be capable of controlling various operations such as flow rate adjusting operations for various gases by the MFCs 312a, 312b, 322a, 512a, 512b and 522a, opening and closing operations of the valves 314a, 314b, 324a, 514a, 514b and 524a, an opening and closing operation of the APC valve 243, a pressure adjusting operation by the APC valve 243 based on the pressure sensor 245, a temperature adjusting operation by the heater 207 based on the temperature sensor 263, a start and stop of the vacuum pump 246, an operation of adjusting the rotation and the rotation speed of the boat 217 by the rotator 267, an elevating and lowering operation of the boat 217 by the boat elevator 115 and an operation of transferring and accommodating the wafer 200 into the boat 217.

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as an MO and a semiconductor memory such as a USB memory and a memory card. The memory 121c or the external memory 123 may be embodied by a non-transitory computer readable recording medium. Hereafter, the memory 121c and the external memory 123 are collectively or individually referred to as a recording medium. In the present specification, the term "recording medium" may refer to the memory 121c alone, may refer to the external memory 123 alone, and may refer to both of the memory 121c and the external memory 123. Instead of the external memory 123, a communication means such as the Internet and a dedicated line may be used for providing the program to the computer.

(2) Substrate Processing (Film-Forming Process)

Figure 7:
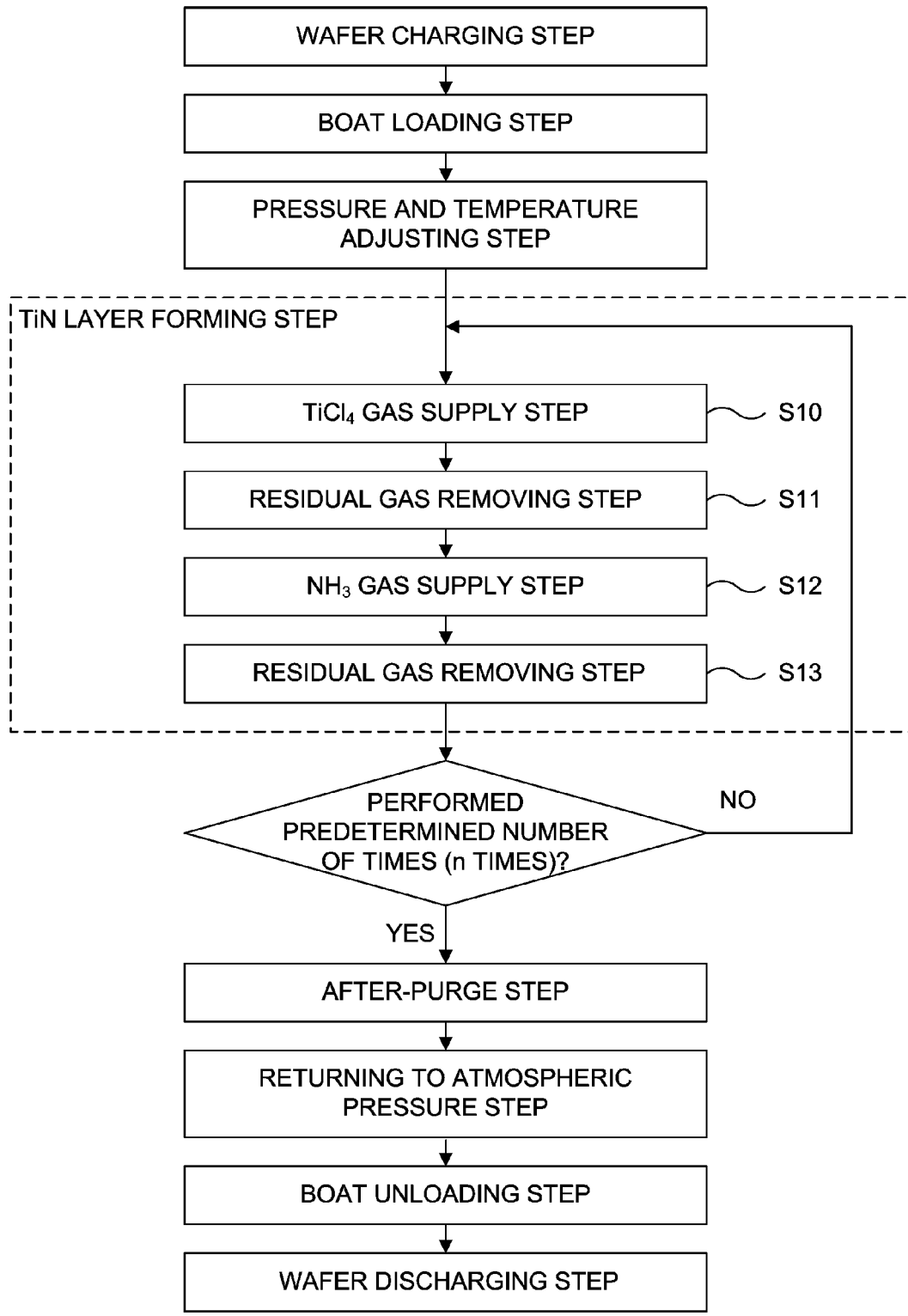
FIG. 7 is a flowchart schematically illustrating a substrate processing of the substrate processing apparatus according to the first embodiment described herein.

Hereinafter, as a part of a manufacturing process of the semiconductor device (that is, the method of manufacturing the semiconductor device), an example of a substrate processing (film-forming process) of forming a metal film on the wafer 200 will be described with reference to FIG. 7. The substrate processing of forming the metal film is performed using the process furnace 202 of the substrate processing apparatus 10 described above. In the following description, the operations of the components constituting the substrate processing apparatus 10 are controlled by the controller 121.

In the present specification, the term "wafer" may refer to "a wafer itself", or may refer to "a wafer and a stacked structure (aggregated structure) of a predetermined layer (or layers) or a film (or films) formed on a surface of a wafer". In the present specification, the term "a surface of a wafer" may refer to "a surface of a wafer itself", or may refer to "a surface of a predetermined layer or a film formed on a wafer". Thus, in the present specification, "forming a predetermined layer (or film) on a wafer" may refer to "forming a predetermined layer (or film) on a surface of a wafer itself", or may refer to "forming a predetermined layer (or film) on a surface of another layer or another film formed on a wafer". In the present specification, the terms "substrate" and "wafer" may be used as substantially the same meaning. That is, the term "substrate" may be substituted by "wafer" and vice versa.

<Wafer Charging Step and Boat Loading Step>

The wafers 200 are charged (transferred) into the boat 217 (wafer charging step). After the boat 217 is charged with the wafers 200, as shown in FIG. 1, the boat 217 charged with the wafers 200 is elevated by the boat elevator 115 and loaded (transferred) into the process chamber 201 (boat loading step). With the boat 217 loaded, the seal cap 219 seals a lower end opening of the outer tube 203 (that is, the lower end of the manifold 209) via the O-ring 220$b$.

<Pressure and Temperature Adjusting Step>

The vacuum pump 246 vacuum-exhausts the inner atmosphere of the process chamber 201 until the inner pressure of the process chamber 201 reaches and is maintained at a desired pressure (vacuum degree). The inner pressure of the process chamber 201 is measured by the pressure sensor 245, and the APC valve 243 is feedback-controlled based on the measured pressure information (pressure adjusting step). The vacuum pump 246 continuously vacuum-exhausts the inner atmosphere of the process chamber 201 until at least a processing (that is, the substrate processing) of the wafer 200 is completed. The heater 207 heats the process chamber 201 until the inner temperature of the process chamber 201 reaches and is maintained at a desired temperature. The amount of the current supplied to the heater 207 is feedback-controlled based on the temperature information detected by the temperature sensor 263 such that the desired temperature distribution of the inner temperature of the process chamber 201 is obtained (temperature adjusting step). The heater 207 continuously heats the process chamber 201 until at least the processing of the wafer 200 is completed.

<TiN Layer Forming Step>

Subsequently, a step of forming a metal nitride layer such as a TiN layer serving as a first metal layer is performed.

<TiCl$_4$ Gas Supply Step S10>

The valves 314$a$ and 314$b$ are opened to supply the TiCl$_4$ gas serving as the source gas into the gas supply pipes 310$a$ and 310$b$. Flow rates of the TiCl$_4$ gas supplied into the gas supply pipes 310$a$ and 310$b$ are adjusted by the MFC 312$a$ and 312$b$, respectively, such that a partial pressure balance of the TiCl$_4$ gas reaches and is maintained at a desired value of the partial pressure balance along the stacking direction of the wafer 200. The TiCl$_4$ gas whose flow rate is adjusted is then supplied into the process chamber 201 through the plurality of gas supply holes 411$a$ of the nozzle 410$a$ and the plurality of gas supply holes 411$b$ of the nozzle 410$b$, and is exhausted through the exhaust pipe 231. Thereby, the TiCl$_4$ gas is supplied to the wafers 200. In the TiCl$_4$ gas supply step S10, in parallel with the supply of the TiCl$_4$ gas, the valves 514$a$ and 514$b$ are opened to supply the inert gas such as the N$_2$ gas into the gas supply pipes 510$a$ and 510$b$. Flow rates of the N$_2$ gas supplied into the gas supply pipes 510$a$ and 510$b$ are adjusted by the MFCs 512$a$ and 512$b$, respectively. The N$_2$ gas whose flow rate is adjusted is then supplied into the process chamber 201 together with the TiCl$_4$ gas, and is exhausted through the exhaust pipe 231. In the TiCl$_4$ gas supply step S10, in order to prevent the TiCl$_4$ gas from entering the nozzle 420$a$, the valve 524$a$ is opened to supply the N$_2$ gas into the gas supply pipe 520$a$. The N$_2$ gas supplied into the gas supply pipe 520$a$ is then supplied into the process chamber 201 through the gas supply pipe 320$a$ and the nozzle 420$a$, and is exhausted through the exhaust pipe 231.

In the TiCl$_4$ gas supply step S10, for example, the APC valve 243 is appropriately adjusted (controlled) to adjust the inner pressure of the process chamber 201 to a pressure ranging from 0.1 Pa to 6,650 Pa. For example, supply flow rates of the TiCl$_4$ gas controlled by the MFCs 312$a$ and 312$b$ may be set to a flow rate ranging from 0.1 slm to 2.0 slm, respectively. For example, supply flow rates of the N$_2$ gas controlled by the MFCs 512$a$, 512$b$ and 522$a$ may be set to a flow rate ranging from 0.1 slm to 30 slm, respectively. For example, a supply time (time duration) of supplying the TiCl$_4$ gas to the wafer 200 may be set to a time duration ranging from 0.01 second to 20 seconds. In the TiCl$_4$ gas supply step S10, for example, a temperature of the heater 207 may be set such that a temperature of the wafer 200 reaches and is maintained at a temperature ranging from 250° C. to 550° C. In the present specification, a notation of a numerical range such as "from 0.1 Pa to 6,650 Pa" means a range equal to or higher than 0.1 Pa and equal to or lower than 6,650 Pa. That is, the numerical range "from 0.1 Pa to 6,650 Pa" includes 0.1 Pa and 6,650 Pa. The same also applies to other numerical ranges of a parameter such as a flow rate, a time duration and a temperature described herein.

In the TiCl$_4$ gas supply step S10, the TiCl$_4$ gas and the N$_2$ gas are supplied into the process chamber 201 without any other gas being supplied into the process chamber 201 together with the TiCl$_4$ gas and the N$_2$ gas. By supplying the TiCl$_4$ gas, a titanium-containing layer whose thickness is, for example, within a range from less than a single atomic layer to several atomic layers is formed on the wafer 200 (that is, on a base film on the surface of the wafer 200).

<Residual Gas Removing Step S11>

After the titanium-containing layer is formed, the valves 314$a$ and 314$b$ are closed to stop the supply of the TiCl$_4$ gas. In the residual gas removing step S11, with the APC valve 243 of the exhaust pipe 231 open, the vacuum pump 246 vacuum-exhausts the inner atmosphere of the process chamber 201 to remove a residual gas in the process chamber 201 such as the TiCl$_4$ gas which did not react or which contributed to the formation of the titanium-containing layer out of the process chamber 201. In the residual gas removing step S11, with the valves 514$a$, 514$b$ and 524$a$ open, the N$_2$ gas is continuously supplied into the process chamber 201. The N$_2$ gas serves as a purge gas, which improves the efficiency of removing the residual gas in the process chamber 201 such as the TiCl$_4$ gas which did not react or which contributed to the formation of the titanium-containing layer out of the process chamber 201.

<NH$_3$ Gas Supply Step S12>

After the residual gas in the process chamber 201 is removed from the process chamber 201, the valve 324$a$ is opened to supply the nitrogen-containing gas such as the NH$_3$ gas serving as the reactive gas into the gas supply pipe 320$a$. A flow rate of the NH$_3$ gas supplied into the gas supply pipe 320$a$ is adjusted by the MFC 322$a$. The NH$_3$ gas whose flow rate is adjusted is then supplied into the process chamber 201 through the plurality of gas supply holes 421$a$ of the nozzle 420$a$, and is exhausted through the exhaust pipe 231. Thereby, the NH$_3$ gas is supplied to the wafers 200. In the NH$_3$ gas supply step S12, the valve 524$a$ is closed in order to prevent the N$_2$ gas from being supplied into the process chamber 201 together with the NH$_3$ gas. That is, the NH$_3$ gas is supplied into the process chamber 201 without being diluted with the N$_2$ gas, and is exhausted through the exhaust pipe 231. In parallel with the supply of the NH$_3$ gas, in order to prevent the NH$_3$ gas from entering the nozzles 410$a$ and 410$b$, the valves 514$a$ and 514$b$ are opened to supply the N$_2$ gas into the gas supply pipes 510$a$ and 510$b$. The N$_2$ gas is supplied into the process chamber 201 through the gas supply pipes 310$a$ and 310$b$ and the nozzles 410$a$ and 410$b$, and is exhausted through the exhaust pipe 231. In the NH$_3$ gas supply step S12, the NH$_3$ gas serving as the reactive gas is supplied into the process chamber 201 without being diluted with the N$_2$ gas. Thus, it is possible to improve a film-forming rate of the TiN layer. It is also possible to adjust an atmosphere concentration of the $N_2$ gas in the vicinity of the wafers 200.

When the $NH_3$ gas is supplied, for example, the APC valve 243 is appropriately adjusted (controlled) to adjust the inner pressure of the process chamber 201 to a pressure ranging from 0.1 Pa to 6,650 Pa. For example, a supply flow rate of the $NH_3$ gas controlled by the MFC 322a may be set to a flow rate ranging from 0.1 slm to 20 slm. For example, supply flow rates of the $N_2$ gas controlled by the MFCs 512a and 512b may be set to a flow rate ranging from 0.1 slm to 30 slm, respectively. For example, a supply time (time duration) of supplying the $NH_3$ gas to the wafer 200 may be set to a time duration ranging from 0.01 second to 30 seconds. In the $NH_3$ gas supply step S12, the temperature of the heater 207 is set to the same temperature as that of the $TiCl_4$ gas supply step S10.

In the $NH_3$ gas supply step S12, the $NH_3$ gas and the $N_2$ gas are supplied into the process chamber 201 without any other gas being supplied into the process chamber 201 together with the $NH_3$ gas and the $N_2$ gas. A substitution reaction occurs between the $NH_3$ gas and at least a portion of the titanium-containing layer formed on the wafer 200 in the $TiCl_4$ gas supply step S10. During the substitution reaction, titanium (Ti) contained in the titanium-containing layer and nitrogen (N) contained in the $NH_3$ gas are bonded. As a result, the TiN layer containing titanium and nitrogen is formed on the wafer 200.

<Residual Gas Removing Step S13>

After the TiN layer is formed, the valve 324a is closed to stop the supply of the $NH_3$ gas. Then, a residual gas in the process chamber 201 such as the $NH_3$ gas which did not react or which contributed to the formation of the TiN layer and reaction by-products are removed out of the process chamber 201 in the same manners as in the residual gas removing step S11.

<Performing a Predetermined Number of Times>

By performing a cycle wherein the step S10 through the step S13 described above are sequentially performed in this order at least once (that is, a predetermined number of times (n times)), the TiN layer of a predetermined thickness (for example, 0.1 nm to 2 nm) is formed on the wafer 200. It is preferable that the cycle described above is repeatedly performed a plurality of times, for example, preferably about 10 times to 80 times, and more preferably about 10 times to 15 times.

<After-Purge Step and Returning to Atmospheric Pressure Step>

The $N_2$ gas is supplied into the process chamber 201 through each of the gas supply pipes 510a, 510b and 520a, and is exhausted through the exhaust pipe 231. The $N_2$ gas serves as the purge gas, and the inner atmosphere of the process chamber 201 is purged with the $N_2$ gas serving as the inert gas. Thereby, the residual gas in the process chamber 201 or the by-products remaining in the process chamber 201 are removed from the process chamber 201 (after-purge step). Thereafter, the inner atmosphere of the process chamber 201 is replaced with the inert gas (substitution by the inert gas), and the inner pressure of the process chamber 201 is returned to the normal pressure (atmospheric pressure) (returning to atmospheric pressure step).

<Boat Unloading Step and Wafer Discharging Step>

Thereafter, the seal cap 219 is lowered by the boat elevator 115 and the lower end of the outer tube 203 is opened. The boat 217 with the processed wafers 200 charged therein is unloaded out of the process chamber 201 through the lower end of the outer tube 203 (boat unloading step).

Then, the processed wafers 200 are transferred (discharged) from the boat 217 (wafer discharging step).

Subsequently, operations of adjusting each flow rate of the $TiCl_4$ gas supplied to the nozzles 410a and 410b in the step S10 and effects thereof will be described with reference to FIGS. 8A through 8C and FIGS. 9A through 9C.

In FIGS. 8A through 8C and FIGS. 9A through 9C, the $TiCl_4$ gas is supplied into the process chamber 201 through the nozzles 410a and 410b. Further, in FIGS. 8A through 8C and FIGS. 9A through 9C, the gas flows from the nozzle toward the right direction in the drawings, and a length of each straight line indicates a partial pressure or a flow rate of the gas.

Figure 8A:
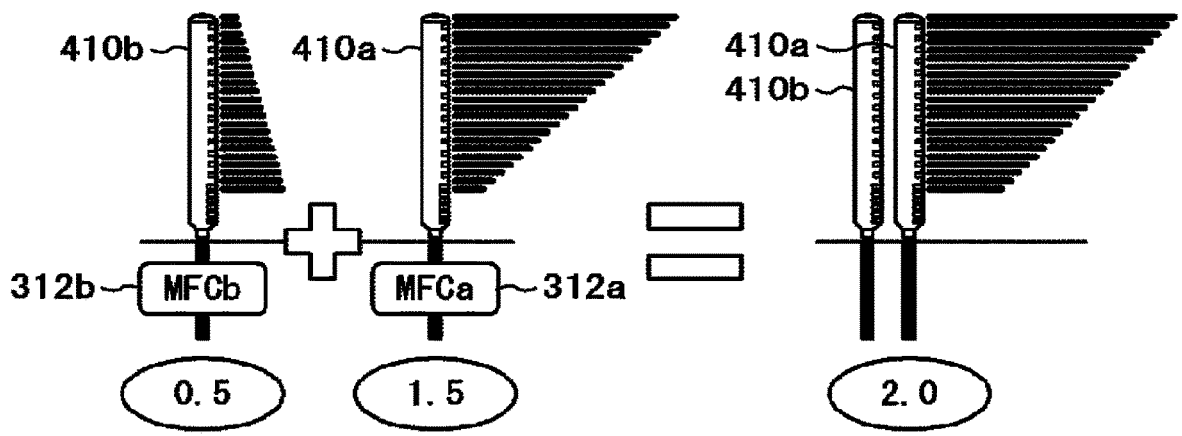
FIGS. 8A through 8C are diagrams for explaining operations of adjusting a flow rate of $TiCl_4$ gas supplied to the nozzles 410a and 410b and an effect thereof according to the first embodiment described herein.
Figure 8B:
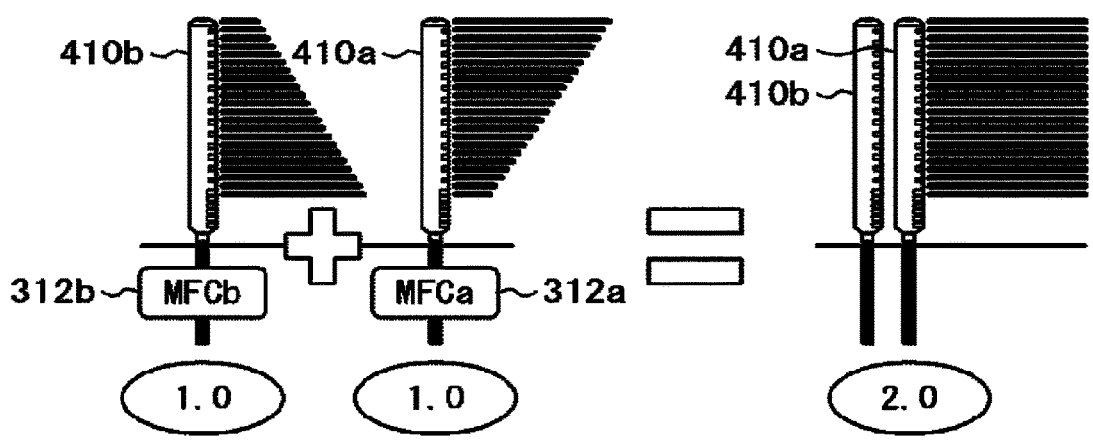
Figure 8C:
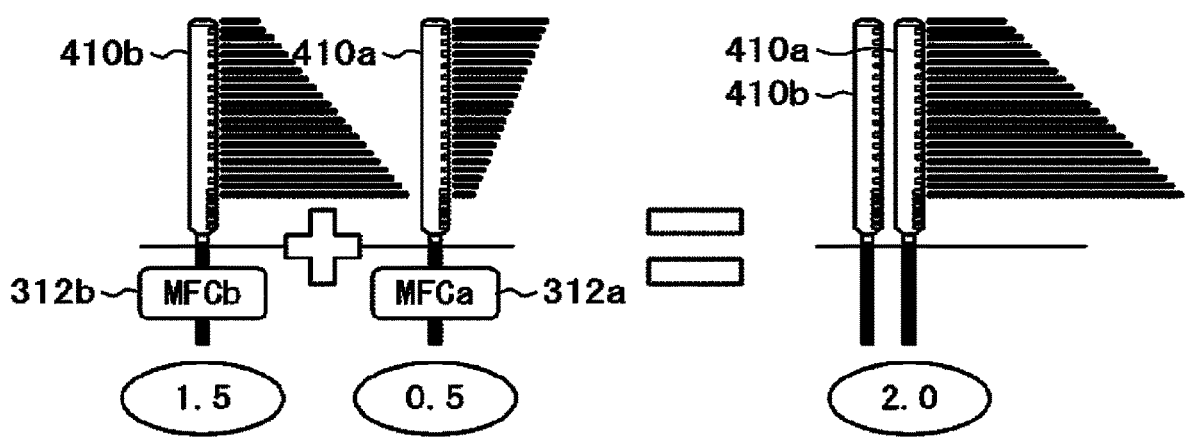

FIG. 8A conceptually illustrates a gas flow in the process chamber 201 when the flow rate of the $TiCl_4$ gas to the nozzle 410a is relatively large ("1.5" shown in FIG. 8A) and the flow rate of the $TiCl_4$ gas to the nozzle 410b is relatively small ("0.5" shown in FIG. 8A). FIG. 8B conceptually illustrates the gas flow in the process chamber 201 when the flow rate of the $TiCl_4$ gas to the nozzle 410a is equal to the flow rate of the $TiCl_4$ gas to the nozzle 410b ("1.0" shown in FIG. 8B). FIG. 8C conceptually illustrates the gas flow in the process chamber 201 when the flow rate of the $TiCl_4$ gas to the nozzle 410a is relatively small ("0.5" shown in FIG. 8C) and the flow rate of the $TiCl_4$ gas to the nozzle 410b is relatively large ("1.5" shown in FIG. 8C).

In an operation example of FIG. 8A, the flow rate and a partial pressure of the $TiCl_4$ gas in a lower region of the nozzles 410a and 410b are smaller than the flow rate and the partial pressure of the $TiCl_4$ gas in an upper region of the nozzles 410a and 410b, respectively. That is, an amount of the $TiCl_4$ gas supplied in the upper region of the nozzles 410a and 410b is greater than that of the $TiCl_4$ gas supplied in the lower region of the nozzles 410a and 410b. Thereby, it is possible to provide a partial pressure balance in which the partial pressure of the $TiCl_4$ gas in the upper region of the nozzles 410a and 410b is higher than that of the $TiCl_4$ gas in the lower region of the nozzles 410a and 410b. Therefore, it is possible to decrease a thickness of the TiN layer formed on the wafer 200 located at a location corresponding to the lower region of the nozzles 410a and 410b, and it is also possible to increase a thickness of the TiN layer formed on the wafer 200 located at a location corresponding to the upper region of the nozzles 410a and 410b.

In an operation example of FIG. 8B, the flow rate and the partial pressure of the $TiCl_4$ gas in the lower region of the nozzles 410a and 410b are substantially equal to the flow rate and the partial pressure of the $TiCl_4$ gas in the upper region of the nozzles 410a and 410b, respectively. That is, the amount of the $TiCl_4$ gas supplied in the upper region of the nozzles 410a and 410b is substantially equal to that of the $TiCl_4$ gas supplied in the lower region of the nozzles 410a and 410b. Thereby, it is possible to provide a partial pressure balance in which the partial pressure of the $TiCl_4$ gas in the upper region of the nozzles 410a and 410b is substantially equal to that of the $TiCl_4$ gas in the lower region of the nozzles 410a and 410b. Therefore, it is possible to form the TiN layer on the wafers 200 such that the thickness of the TiN layer formed on the wafer 200 located at a location corresponding to the lower region of the nozzles 410a and 410b is substantially equal to the thickness of the TiN layer formed on the wafer 200 located at a location corresponding to the upper region of the nozzles 410a and 410b.

In an operation example of FIG. 8C, the flow rate and the partial pressure of the $TiCl_4$ gas in the lower region of the nozzles 410a and 410b are greater than the flow rate and the partial pressure of the $TiCl_4$ gas in the upper region of the nozzles 410a and 410b, respectively. That is, the amount of the $TiCl_4$ gas supplied in the lower region of the nozzles 410a and 410b is greater than that of the $TiCl_4$ gas supplied in the upper region of the nozzles 410a and 410b. Thereby, it is possible to provide a partial pressure balance in which the partial pressure of the $TiCl_4$ gas in the lower region of the nozzles 410a and 410b is higher than that of the $TiCl_4$ gas in the upper region of the nozzles 410a and 410b. Therefore, it is possible to decrease the thickness of the TiN layer formed on the wafer 200 located at a location corresponding to the upper region of the nozzles 410a and 410b, and it is also possible to increase the thickness of the TiN layer formed on the wafer 200 located at a location corresponding to the lower region of the nozzles 410a and 410b.

Figure 9A:
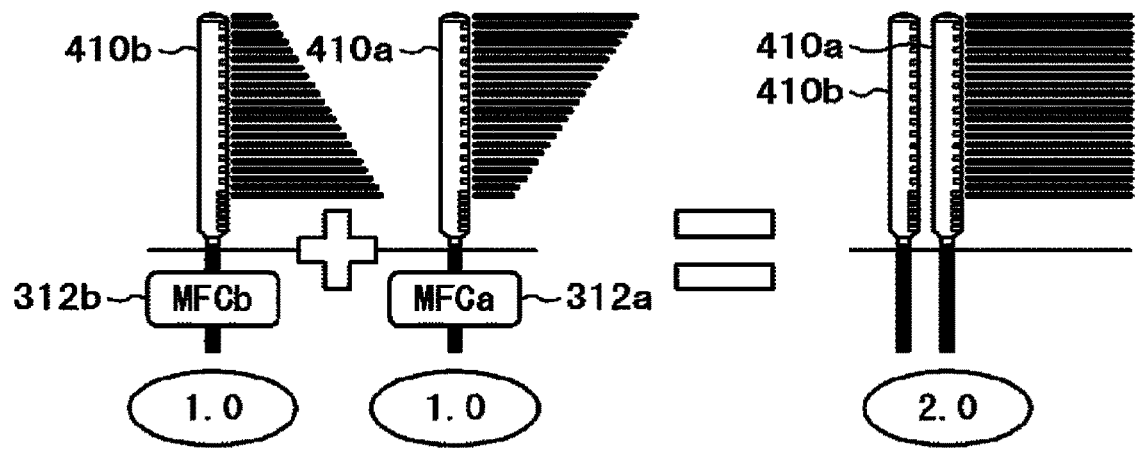
FIGS. 9A through 9C are diagrams for explaining operations of adjusting the flow rate of the $TiCl_4$ gas supplied to the nozzles 410a and 410b and an effect thereof according to the first embodiment described herein.
Figure 9B:
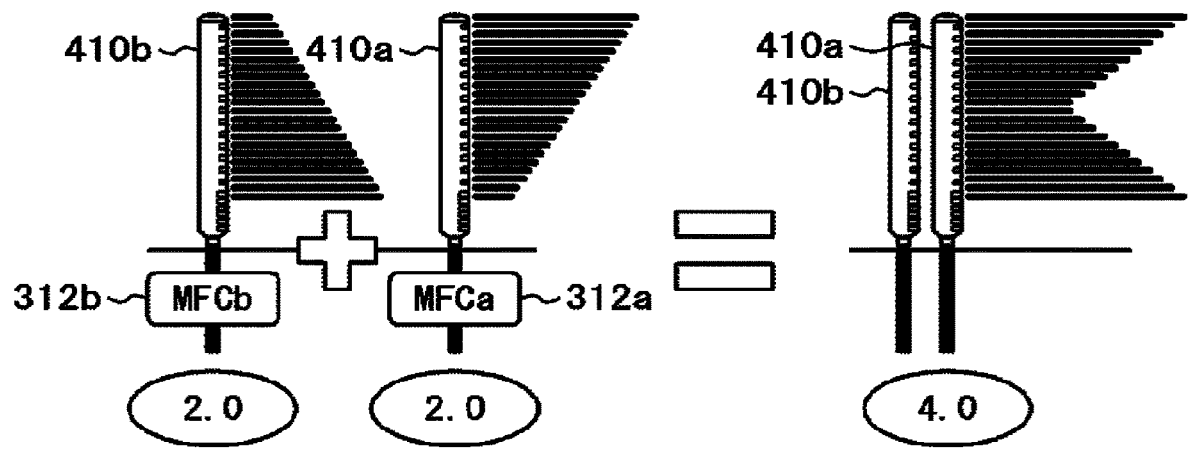
Figure 9C:
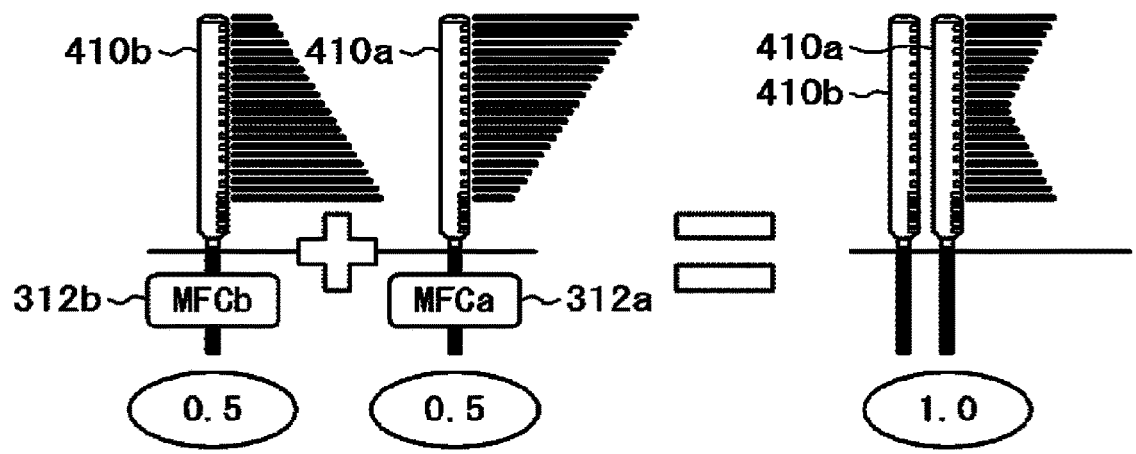

FIG. 9A conceptually illustrates the gas flow in the process chamber 201 when the flow rates of the $TiCl_4$ gas to the nozzles 410a and 410b ("1.0" shown in FIG. 9A) are set to the same as the flow rates of the $TiCl_4$ gas to the nozzles 410a and 410b in FIG. 8B. FIG. 9B conceptually illustrates the gas flow in the process chamber 201 when the flow rates of the $TiCl_4$ gas to the nozzles 410a and 410b ("2.0" shown in FIG. 9B) are twice the flow rates of the $TiCl_4$ gas to the nozzles 410a and 410b in FIG. 8B. FIG. 9C conceptually illustrates the gas flow in the process chamber 201 when the flow rates of the $TiCl_4$ gas to the nozzles 410a and 410b ("0.5" shown in FIG. 9C) are half the flow rates of the $TiCl_4$ gas to the nozzles 410a and 410b in FIG. 8B.

In an operation example of FIG. 9B, the flow rate and the partial pressure of the $TiCl_4$ gas in each of the lower region and the upper region of the nozzles 410a and 410b are greater than the flow rate and the partial pressure of the $TiCl_4$ gas in a central region of the nozzles 410a and 410b, respectively, and are greater than those of the $TiCl_4$ gas in the operation example of FIG. 8B. That is, the amount of the $TiCl_4$ gas supplied in each of the lower region and the upper region of the nozzles 410a and 410b is greater than that of the $TiCl_4$ gas supplied in the central region of the nozzles 410a and 410b. Thereby, it is possible to provide a partial pressure balance in which the partial pressure of the $TiCl_4$ gas in each of the lower region and the upper region of the nozzles 410a and 410b is higher than that of the $TiCl_4$ gas in the central region of the nozzles 410a and 410b. Therefore, it is possible to decrease the thickness of the TiN layer formed on the wafer 200 located at a location corresponding to the central region of the nozzles 410a and 410b, and it is also possible to increase the thickness of the TiN layer formed on the wafer 200 located at a location corresponding to the upper region or the lower region of the nozzles 410a and 410b. It is also possible to increase the thickness of the TiN layer formed on the wafer 200 located at a location corresponding to the upper region or the lower region of the nozzles 410a and 410 as compared with that of the TiN layer formed on the wafer 200 in the operation example of FIG. 8B.

In an operation example of FIG. 9C, the flow rate and the partial pressure of the $TiCl_4$ gas in each of the lower region and the upper region of the nozzles 410a and 410b are greater than the flow rate and the partial pressure of the $TiCl_4$ gas in the central region of the nozzles 410a and 410b, respectively, and are smaller than those of the $TiCl_4$ gas in the operation example of FIG. 8B. That is, the amount of the $TiCl_4$ gas supplied in each of the lower region and the upper region of the nozzles 410a and 410b is greater than that of the $TiCl_4$ gas supplied in the central region of the nozzles 410a and 410b. Thereby, it is possible to provide a partial pressure balance in which the partial pressure of the $TiCl_4$ gas in each of the lower region and the upper region of the nozzles 410a and 410b is higher than that of the $TiCl_4$ gas in the central region of the nozzles 410a and 410b. Therefore, it is possible to decrease the thickness of the TiN layer formed on the wafer 200 located at a location corresponding to the central region of the nozzles 410a and 410b, and it is also possible to increase the thickness of the TiN layer formed on the wafer 200 located at a location corresponding to the upper region or the lower region of the nozzles 410a and 410b. It is also possible to decrease the thickness of the TiN layer formed on the wafer 200 located at a location corresponding to the upper region or the lower region of the nozzles 410a and 410b as compared with that of the TiN layer formed on the wafer 200 in the operation example of FIG. 8B.

Figure 3:
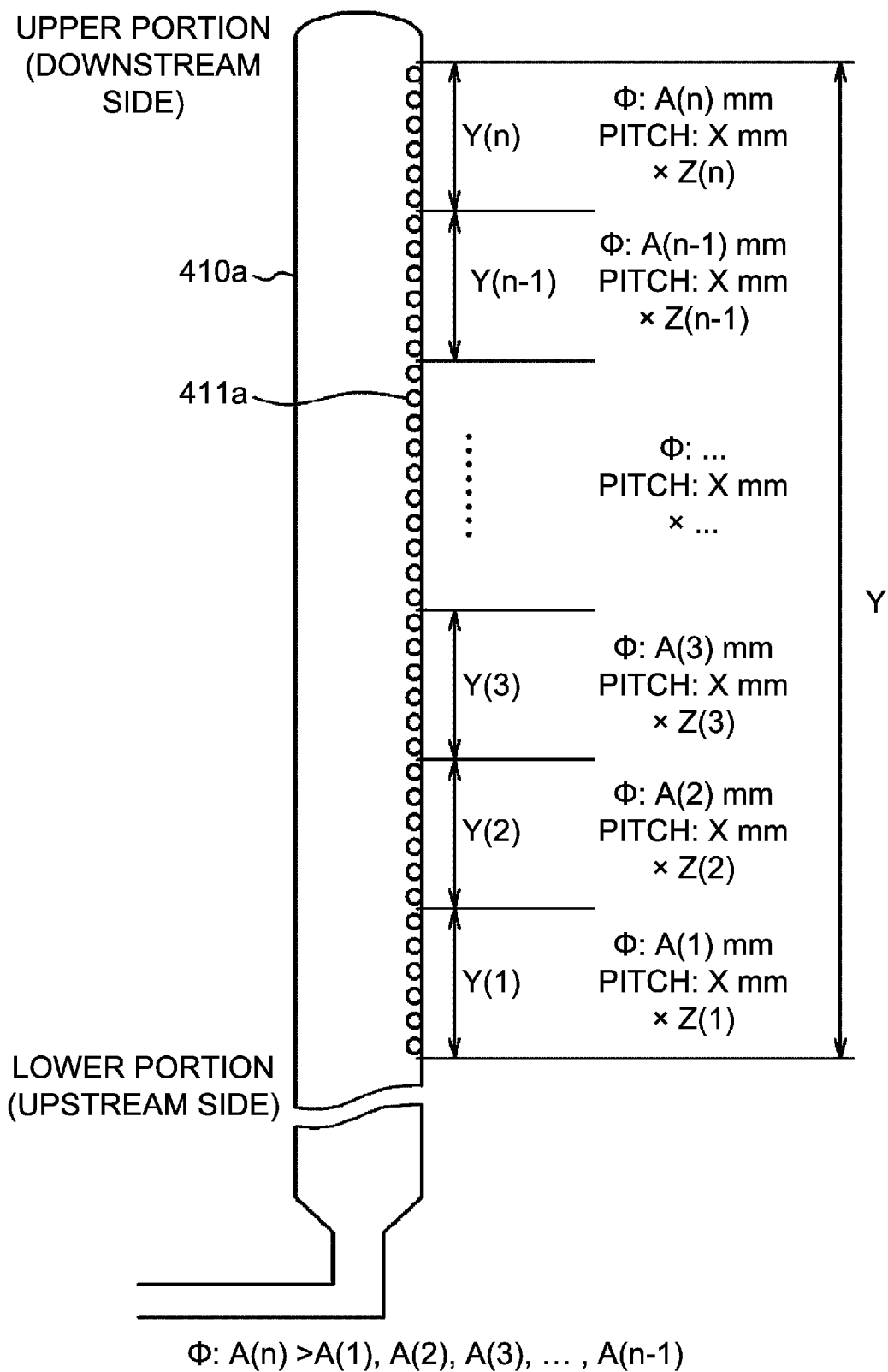
FIG. 3 is a diagram conceptually illustrating a configuration of a plurality of gas supply holes 411a of a nozzle 410a of the substrate processing apparatus according to the first embodiment described herein.
Figure 4:
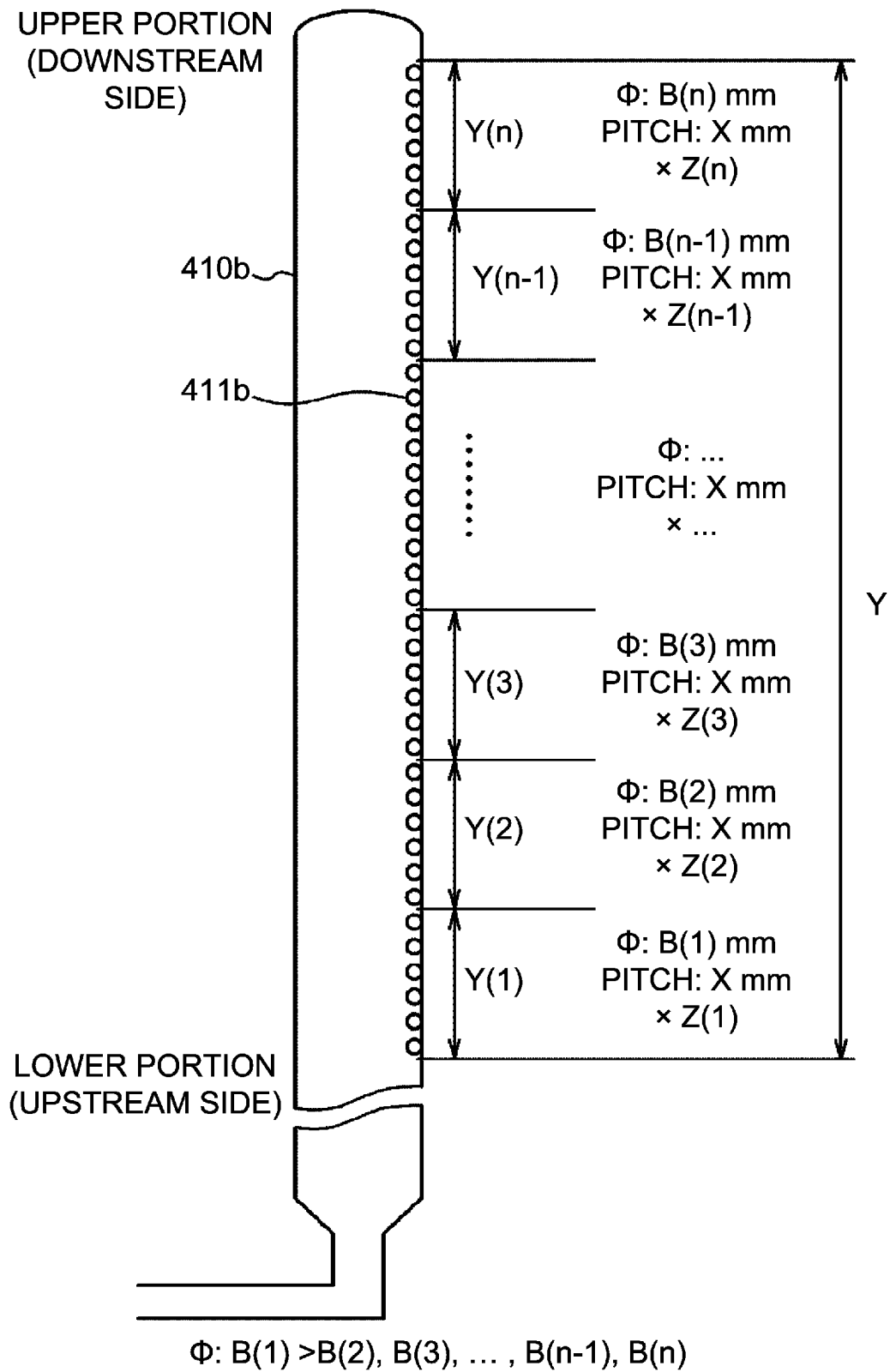
FIG. 4 is a diagram conceptually illustrating a configuration of a plurality of gas supply holes 411b of a nozzle 410b of the substrate processing apparatus according to the first embodiment described herein.

As can be understood from FIGS. 8A through 8C and FIGS. 9A through 9C, by adjusting the flow rate of the process gas such as the $TiCl_4$ gas supplied to the nozzles 410a and 410b by using the nozzle 410a shown in FIG. 3 and the nozzle 410b shown in FIG. 4, it is possible to adjust the partial pressure balance of the process gas supplied into the process chamber 201 through the plurality of gas supply holes 411a of the nozzle 410a and the plurality of gas supply holes 411b of the nozzle 410b to a desired value of the partial pressure balance. Thereby, it is possible to improve a thickness uniformity of the TiN layer between the wafers 200 stacked (accommodated) in the process chamber 201.

According to the first embodiment described above, it is possible to obtain at least one among the following effects (a) and (b).

(a) By adjusting the flow rate of the source gas such as the $TiCl_4$ gas supplied to the nozzles 410a and 410b by using the nozzle 410a provided with the plurality of gas supply holes 411a (wherein the opening area of each of the gas supply holes 411a provided in the nozzle 410a increases along the direction from the upstream side to the downstream side of the nozzle 410a) as shown in FIG. 3 and the nozzle 410b (wherein the opening area of each of the gas supply holes 411b provided in the nozzle 410b increases along the direction from the downstream side to the upstream side of the nozzle 410b) as shown in FIG. 4, it is possible to adjust the partial pressure balance of the source gas such as the $TiCl_4$ gas in the process chamber 201.

(b) By using (a) described above, it is possible to adjust a thickness balance of the film between the plurality of substrates stacked in the process chamber 201.

Modified Example of First Embodiment

The first embodiment described above is described by way of an example in which the source gas is supplied to two nozzles (that is, the nozzles 410a and 410b) whose gas ejection characteristics are different from each other and the reactive gas is supplied to one nozzle (that is, the nozzle 420a). According to a modified example of the first embodiment, the reactive gas is supplied to two nozzles (that is, the nozzles 410a and 410b) whose gas ejection characteristics are different from each other, and the source gas is supplied to one nozzle (that is, the nozzle 420a). Hereinafter, portions of the modified example different from those of the first embodiment will be described in detail, and the description of portions of the modified example the same as the first embodiment will be omitted.

According to the modified example of the first embodiment, the same source gas as in the first embodiment serving as the process gas is supplied into the process chamber 201 through the gas supply pipe 320a provided with the MFC 322a and the valve 324a and the nozzle 420a.

The same reactive gas as in the first embodiment serving as the process gas is supplied into the process chamber 201 through the gas supply pipes 310a and 310b provided with the MFCs 312a and 312b and the valves 314a and 314b, respectively, and the nozzles 410a and 410b.

Similar to the first embodiment, according to the modified example of the first embodiment, by adjusting the flow rate of the process gas such as the NH$_3$ gas supplied to the nozzles 410a and 410b by using the nozzle 410a shown in FIG. 3 and the nozzle 410b shown in FIG. 4, it is possible to adjust the partial pressure balance of the process gas supplied into the process chamber 201 through the plurality of gas supply holes 411a of the nozzles 410a and the plurality of gas supply holes 411b of the nozzle and 410b to a desired value of the partial pressure balance. Thereby, it is possible to improve the thickness uniformity of the TiN layer between the wafers 200 stacked (accommodated) in the process chamber 201. In addition, by adjusting the flow rate of the purge gas such as the N$_2$ gas supplied to the nozzles 410a and 410b, it is possible to adjust the partial pressure balance of the purge gas supplied into the process chamber 201 through the plurality of gas supply holes 411a of the nozzles 410a and the plurality of gas supply holes 411b of the nozzle and 410b to a desired value of the partial pressure balance.

Second Embodiment

The first embodiment described above is described by way of an example in which the process gas of the same type (source gas) is supplied to two nozzles (that is, the nozzles 410a and 410b) whose gas ejection characteristics are different from each other and another type of process gas (the reactive gas) is supplied to one nozzle (that is, the nozzle 420a). According to a second embodiment, the source gas is supplied to two nozzles (that is, the nozzles 410a and 410b) whose gas ejection characteristics are different from each other and the reactive gas is supplied to another two nozzles (that is, the nozzle 420a and a nozzle 420b described later) whose gas ejection characteristics are different from each other. Hereinafter, portions of the second embodiment different from those of the first embodiment will be described in detail, and the description of portions of the second embodiment the same as the first embodiment will be omitted.

Figure 10:
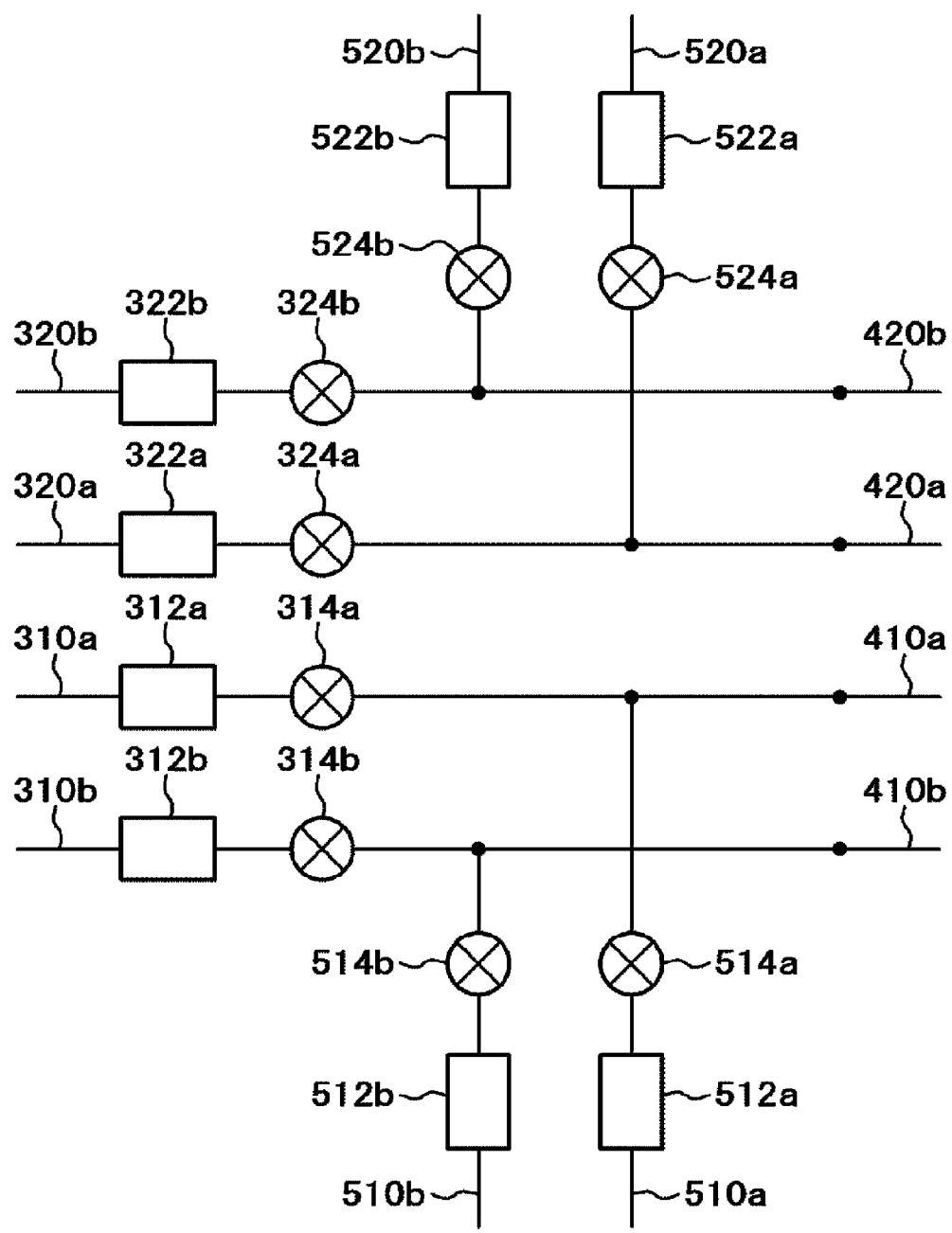
FIG. 10 is a diagram schematically illustrating a gas supplier of a substrate processing apparatus according to a second embodiment described herein.
Figure 11:
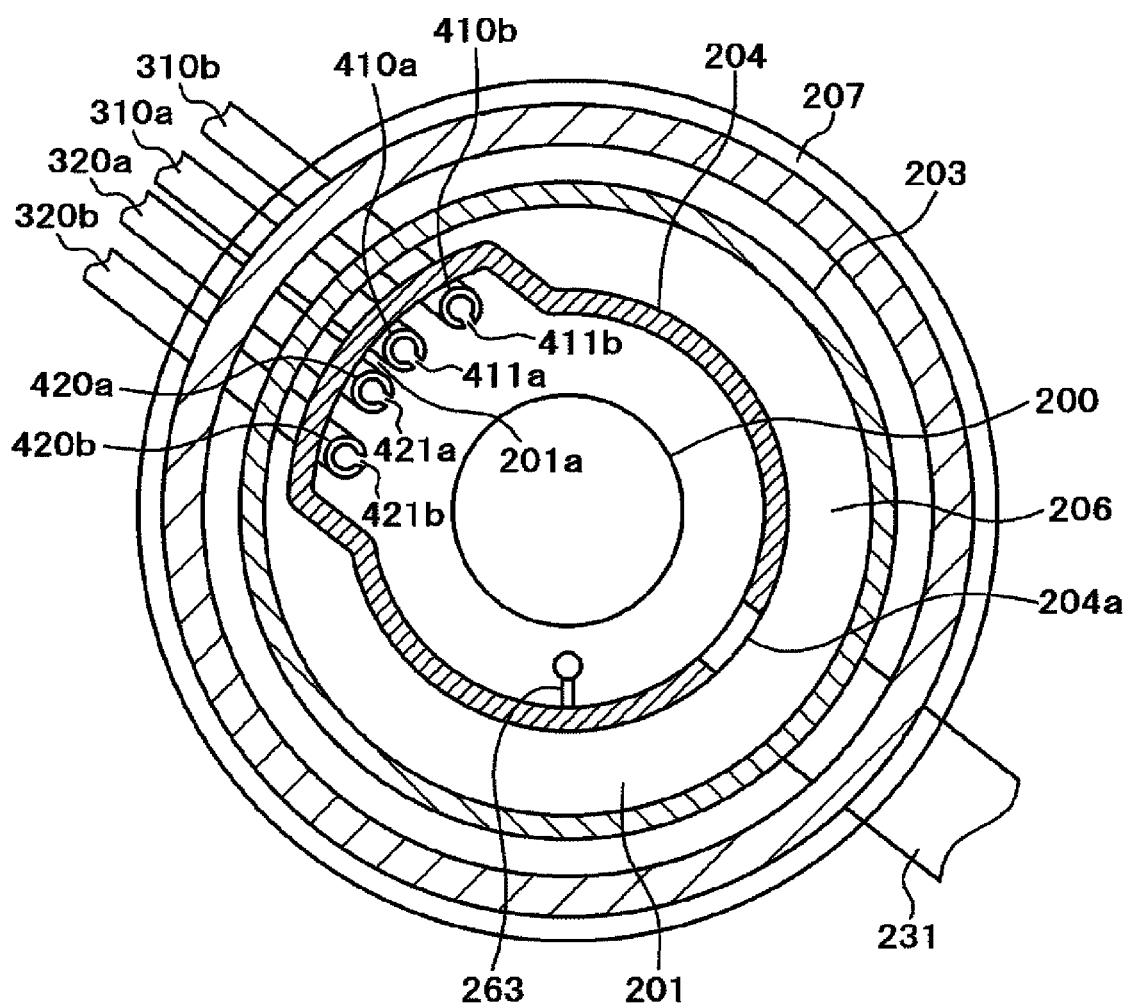
FIG. 11 is a diagram schematically illustrating a cross-section of a vertical type process furnace of the substrate processing apparatus according to the second embodiment described herein.

As shown in FIGS. 10 and 11, the nozzle 410a (first nozzle), the nozzle 410b (second nozzle), the nozzle 420a (third nozzle) and the nozzle 420b (also referred to as a "fourth nozzle") are installed in the process chamber 201 so as to penetrate the side wall of the manifold 209 and the inner tube 204. Gas supply pipes 310a, 310b, 320a and 320b serving as gas supply lines are connected to the nozzles 410a, 410b, 420a and 420b, respectively. As shown in FIG. 11, the four nozzles 410a, 410b, 420a and 420b and the four gas supply pipes 310a, 310b, 320a and 320b are provided in the substrate processing apparatus 10, and it is possible to supply various gases into the process chamber 201 through the four nozzles 410a, 410b, 420a and 420b and the four gas supply pipes 310a, 310b, 320a and 320b. However, the process furnace 202 of the present embodiment is not limited to the example described above.

As shown in FIG. 10, MFCs 312a, 312b, 322a and 322b and valves 314a, 314b, 324a and 324b are sequentially installed at the gas supply pipes 310a, 310b, 320a and 320b in this order from upstream sides to downstream sides of the gas supply pipes 310a, 310b, 320a and 320b, respectively. Gas supply pipes 510a, 510b, 520a and 520b through which the inert gas is supplied are connected to the gas supply pipes 310a, 310b, 320a and 320b at downstream sides of the valves 314a, 314b, 324a and 324b, respectively. MFCs 512a, 512b, 522a and 522b and valves 514a, 514b, 524a and 524b are sequentially installed at the gas supply pipes 510a, 510b, 520a and 520b in this order from upstream sides to downstream sides of the gas supply pipes 510a, 510b, 520a and 520b, respectively.

As shown in FIG. 11, the nozzles 410a, 410b, 420a and 420b are connected to front ends (tips) of the gas supply pipes 310a, 310b, 320a and 320b, respectively. Each of the nozzles 410a, 410b, 420a and 420b may include an L-shaped nozzle. Horizontal portions of the nozzles 410a, 410b, 420a and 420b are installed so as to penetrate the side wall of the manifold 209 and the inner tube 204. Vertical portions of the nozzles 410a, 410b, 420a and 420b are installed in the spare chamber 201a of a channel shape (a groove shape) protruding outward in the radial direction of the inner tube 204 and extending in the vertical direction. That is, the vertical portions of the nozzles 410a, 410b, 420a and 420b are installed in the spare chamber 201a toward the upper portion of the inner tube 204 and along the inner wall of the inner tube 204.

The nozzles 410a, 410b, 420a and 420b extend from the lower region of the process chamber 201 to the upper region of the process chamber 201. The nozzles 410a, 410b, 420a and 420b are provided with the plurality of gas supply holes 411a, the plurality of gas supply holes 411b, the plurality of gas supply holes 421a and a plurality of gas supply holes (which are gas supply ports) 421b facing the wafers 200, respectively. Thereby, the gas such as the process gas can be supplied to the wafers 200 through the plurality of gas supply holes 411a of the nozzle 410a, the plurality of gas supply holes 411b of the nozzle 410b, the plurality of gas supply holes 421a of the nozzle 420a, and the plurality of gas supply holes 421b of the nozzle 420b. The plurality of gas supply holes 411a of the nozzle 410a and the plurality of gas supply holes 421a of the nozzle 420a according to the second embodiment are substantially the same as the plurality of gas supply holes 411a of the nozzle 410a shown in FIG. 3, and the plurality of gas supply holes 411b of the nozzle 410b and the plurality of gas supply holes 421b of the nozzle 420b according to the second embodiment are substantially the same as the plurality of gas supply holes 411b of the nozzle 410b shown in FIG. 4.

According to the second embodiment, the same source gas as in the first embodiment serving as the process gas is supplied into the process chamber 201 through the gas supply pipes 310a and 310b provided with the MFCs 312a and 312b and the valves 314a and 314b, respectively, and the nozzles 410a and 410b.

According to the second embodiment, the same reactive gas as in the first embodiment serving as the process gas is supplied into the process chamber 201 through the gas supply pipes 320a and 320b provided with the MFCs 322a and 322b and the valves 324a and 324b, respectively, and the nozzles 420a and 420b.

According to the second embodiment, the same reactive gas as in the first embodiment serving as the inert gas is supplied into the process chamber 201 through the gas supply pipes 510a, 510b, 520a and 520b provided with the MFCs 512a, 512b, 522a and 522b and the valves 514a, 514b, 524a and 524b, respectively, and the nozzles 410a, 410b, 420a and 420b.

TiCl$_4$ Gas Supply Step S10 of Second Embodiment

The valves 314a and 314b are opened to supply the TiCl$_4$ gas serving as the source gas into the gas supply pipes 310a and 310b. The flow rates of the TiCl$_4$ gas supplied into the gas supply pipes 310a and 310b are adjusted by the MFC 312a and 312b, respectively. The TiCl$_4$ gas whose flow rate is adjusted is then supplied into the process chamber 201 through the plurality of gas supply holes 411a of the nozzle 410a and the plurality of gas supply holes 411b of the nozzle 410b, and is exhausted through the exhaust pipe 231. Thereby, the TiCl$_4$ gas is supplied to the wafers 200. In the TiCl$_4$ gas supply step S10 of the second embodiment, in parallel with the supply of the TiCl$_4$ gas, the valves 514a and 514b are opened to supply the inert gas such as the N$_2$ gas into the gas supply pipes 510a and 510b. The flow rates of the N$_2$ gas supplied into the gas supply pipes 510a and 510b are adjusted by the MFC 512a and 512b, respectively. The N$_2$ gas whose flow rate is adjusted is then supplied into the process chamber 201 together with the TiCl$_4$ gas, and is exhausted through the exhaust pipe 231. In the TiCl$_4$ gas supply step S10 of the second embodiment, in order to prevent the TiCl$_4$ gas from entering the nozzles 420a and 420b and in order to adjust a concentration distribution of the process gas (source gas), the valves 524a and 524b are opened to supply the N$_2$ gas into the gas supply pipes 520a and 520b. The N$_2$ gas supplied into the gas supply pipes 520a and 520b is then supplied into the process chamber 201 through the gas supply pipes 320a and 320b and the nozzles 420a and 420b, and is exhausted through the exhaust pipe 231.

NH$_3$ Gas Supply Step S12 of Second Embodiment

After the residual gas in the process chamber 201 is removed from the process chamber 201, the valves 324a and 324b are opened to supply the nitrogen-containing gas such as the NH$_3$ gas serving as the reactive gas into the gas supply pipes 320a and 320b. Flow rates of the NH$_3$ gas supplied into the gas supply pipes 320a and 320b are adjusted by the MFCs 322a and 322b, respectively, such that a partial pressure balance of the NH$_3$ gas reaches and is maintained at a desired value of the partial pressure balance along the stacking direction of the wafer 200. The NH$_3$ gas whose flow rate is adjusted is then supplied into the process chamber 201 through the plurality of gas supply holes 421a of the nozzle 420a and the plurality of gas supply holes 421b of the nozzle 420b, and is exhausted through the exhaust pipe 231. Thereby, the NH$_3$ gas is supplied to the wafers 200. In the NH$_3$ gas supply step S12 of the second embodiment, the valves 524a and 524b are closed in order to prevent the N$_2$ gas from being supplied into the process chamber 201 together with the NH$_3$ gas. That is, the NH$_3$ gas is supplied into the process chamber 201 without being diluted with the N$_2$ gas, and is exhausted through the exhaust pipe 231. In parallel with the supply of the NH$_3$ gas, in order to prevent the NH$_3$ gas from entering the nozzles 410a and 410b and in order to adjust a concentration distribution of the process gas (reactive gas), the valves 514a and 514b are opened to supply the N$_2$ gas into the gas supply pipes 510a and 510b. The N$_2$ gas is supplied into the process chamber 201 through the gas supply pipes 310a and 310b and the nozzles 410a and 410b, and is exhausted through the exhaust pipe 231. In the NH$_3$ gas supply step S12 of the second embodiment, the NH$_3$ gas serving as the reactive gas is supplied into the process chamber 201 without being diluted with the N$_2$ gas. Thus, it is possible to improve the film-forming rate of the TiN layer. It is also possible to adjust the atmosphere concentration of the N$_2$ gas in the vicinity of the wafers 200.

Subsequently, operations of adjusting the flow rate of the N$_2$ gas supplied to the nozzles 420a and 420b in the step S10 of the second embodiment and effects thereof will be described with reference to FIGS. 12A and 12B.

Figure 12A:
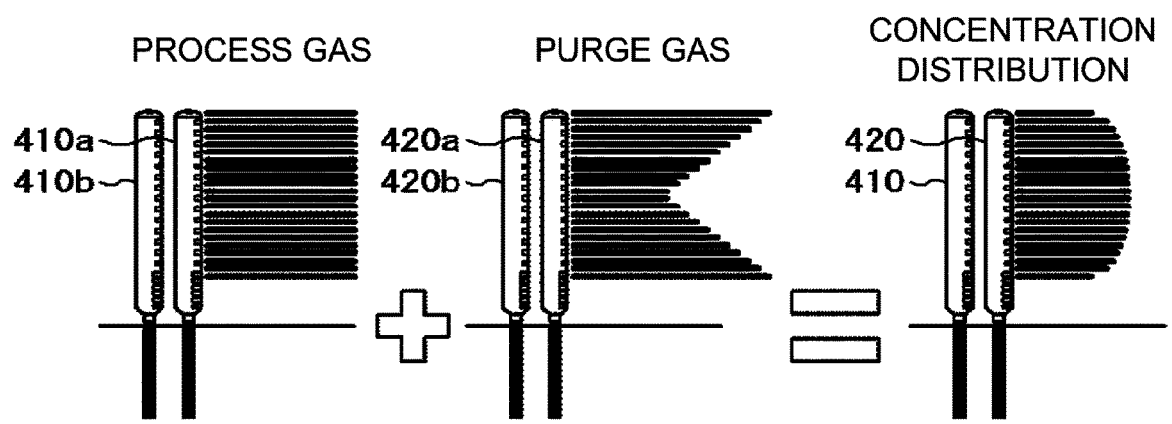
FIGS. 12A through 12B are diagrams for explaining adjustments of the flow rate of the $TiCl_4$ gas supplied to the nozzles 410a and 410b and a flow rate of $N_2$ gas supplied to nozzles 420a and 420b and effects thereof according to the second embodiment described herein.
Figure 12B:
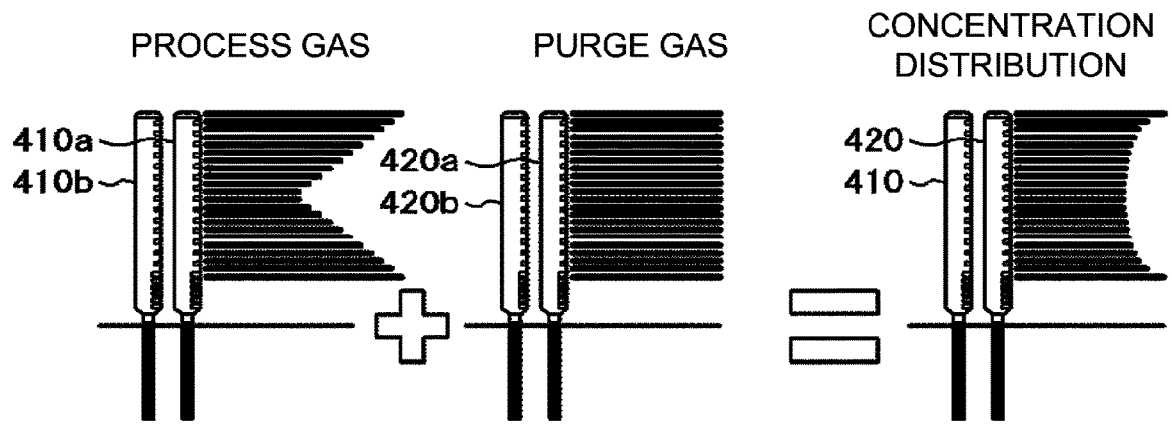

In FIGS. 12A and 12B, the TiCl$_4$ gas is supplied into the process chamber 201 through the nozzles 410a and 410b and the N$_2$ gas is supplied into the process chamber 201 through the nozzles 420a and 420b. Further, in FIGS. 12A and 12B, the gas flows from the nozzles toward the right direction in the drawings, and a length of each straight line indicates a partial pressure of the gas, a flow rate of the gas or a concentration distribution of the gas. The nozzles 410a and 410b are collectively referred to as a nozzle 410, and the nozzles 420a and 420b are collectively referred to as a nozzle 420.

FIG. 12A conceptually illustrates the gas flow in the process chamber 201 when the flow rate of the TiCl$_4$ gas ejected through the nozzles 410a and 410b is set to be the same as the flow rate of the TiCl$_4$ gas ejected through the nozzles 410a and 410b in FIG. 9A and the flow rate of the N$_2$ gas ejected through the nozzles 420a and 420b is set to be the same as the flow rate of the TiCl$_4$ gas ejected through the nozzles 410a and 410b in FIG. 9B. FIG. 12B conceptually illustrates the gas flow in the process chamber 201 when the flow rate of the TiCl$_4$ gas ejected through the nozzles 410a and 410b is set to be the same as the flow rate of the TiCl$_4$ gas ejected through the nozzles 410a and 410b in FIG. 9B and the flow rate of the N$_2$ gas ejected through the nozzles 420a and 420b is set to be the same as the flow rate of the TiCl$_4$ gas ejected through the nozzles 410a and 410b in FIG. 9A.

In an operation example of FIG. 12A, the flow rate and a partial pressure of the N$_2$ gas in each of a lower region and an upper region of the nozzles 420a and 420b are greater than the flow rate and the partial pressure of the N$_2$ gas in a central region of the nozzles 420a and 420b, respectively. That is, as shown at a right end portion of FIG. 12A, it is possible to provide a concentration distribution in which the concentration of the TiCl$_4$ gas in a central region of the nozzles 410 and 420 is higher than that of the TiCl$_4$ gas in an upper region or a lower region of the nozzles 410 and 420. In such a case, a change in the concentration distribution is gradual as compared with the first embodiment. Therefore, it is possible to decrease the thickness of the TiN layer formed on the wafer 200 located at a location corresponding to the upper region or the lower region of the nozzles 410 and 420, and it is also possible to increase the thickness of the TiN layer formed on the wafer 200 located at a location corresponding to the central region of the nozzles 410 and 420.

In an operation example of FIG. 12B, the flow rate and the partial pressure of the TiCl$_4$ gas in each of the lower region and the upper region of the nozzles 410a and 410b are greater than the flow rate and the partial pressure of the TiCl$_4$ gas in the central region of the nozzles 410a and 410b, respectively. That is, as shown at a right end portion of FIG. 12B, it is possible to provide a concentration distribution in which the concentration of the TiCl$_4$ gas in the upper region or the lower region of the nozzles 410 and 420 is higher than that of the TiCl$_4$ gas in the central region of the nozzles 410 and 420. In such a case, the change in the concentration distribution is gradual as compared with the first embodiment. Therefore, it is possible to increase the thickness of the TiN layer formed on the wafer 200 located at a location corresponding to the upper region or the lower region of the nozzles 410 and 420, and it is also possible to decrease the thickness of the TiN layer formed on the wafer 200 located at a location corresponding to the central region of the nozzles 410 and 420.

Similar to the operations of adjusting the flow rate of the $N_2$ gas supplied to the nozzles 420a and 420b in the step S10 of the second embodiment described above, by adjusting the flow rate of the $N_2$ gas supplied to the nozzles 410a and 410b in the step S12 of the second embodiment described above, it is possible to provide a concentration distribution of the $NH_3$ gas as described in FIGS. 12A and 12B.

According to the second embodiment described above, it is possible to obtain at least one among the following effects (a) through (d).

(a) By adjusting the flow rate of the source gas such as the $TiCl_4$ gas supplied to the nozzles 410a and 410b and adjusting the flow rate of the reactive gas such as the $NH_3$ gas supplied to the nozzles 420a and 420b, it is possible to adjust the partial pressure balance of the source gas ($TiCl_4$ gas) and the reactive gas ($NH_3$ gas) in the process chamber 201.

(b) By adjusting the flow rate of the source gas such as the $TiCl_4$ gas supplied to the nozzles 410a and 410b and adjusting the flow rate of the $N_2$ gas supplied to the nozzles 420a and 420b for preventing a backflow of the source gas ($TiCl_4$ gas), it is possible to adjust the concentration distribution of the source gas ($TiCl_4$ gas) in the process chamber 201.

(c) By adjusting the flow rate of the reactive gas such as the $NH_3$ gas supplied to the nozzles 420a and 420b and adjusting the flow rate of the $N_2$ gas supplied to the nozzles 410a and 410b for preventing a backflow of the reactive gas ($NH_3$ gas), it is possible to adjust the concentration distribution of the reactive gas ($NH_3$ gas) in the process chamber 201.

(d) By using one of (a) through (c) described above, it is possible to adjust the thickness balance of the film between the plurality of substrates stacked in the process chamber 201.

Other Embodiments

While the technique is described in detail by way of the embodiments and the modified example, the above-described technique is not limited thereto. The above-described embodiments and the modified example may be appropriately combined.

Further, the above-described technique may also be applied to every type of films formed by a vertical type film-forming apparatus such as the substrate processing apparatus 10 or to every type of gases used in the vertical type film-forming apparatus such as the substrate processing apparatus 10.

For example, by closing the valves 324b and 524b such that the process gas and the inert gas are not supplied to the nozzle 420b in the second embodiment, it is possible to perform the film-forming process in the same manner as in the first embodiment or the modified example of the first embodiment.

The first embodiment and the second embodiment are described in detail by way of an example in which the two nozzles whose gas ejection characteristics are different from each other are used to supply the gas. However, the above-described technique is not limited thereto. The number of nozzles whose gas ejection characteristics are different is not limited to two. Three or more nozzles may be used to supply the gas as long as a gas ejection amount and a gas concentration balance between the plurality of substrates can be adjusted by supplying the same type of the gas.

As described above, according to some embodiments in the present disclosure, it is possible to adjust the thickness balance of the film between the plurality of substrates stacked in the process chamber.

What is claimed is:

1. A method of processing a substrate, comprising:
   (a) stacking and accommodating a plurality of substrates in a process chamber;
   (b) simultaneously performing: (i) supplying a source gas to the plurality of substrates through a first nozzle provided in the process chamber along a stacking direction of the plurality of substrates such that an amount of the source gas supplied through an upper portion of the first nozzle is greater than that of the source gas supplied through a lower portion of the first nozzle; and (ii) supplying the source gas to the plurality of substrates through a second nozzle provided in the process chamber along the stacking direction of the plurality of substrates such that an amount of the source gas supplied through a lower portion of the second nozzle is greater than that of the source gas supplied through an upper portion of the second nozzle; and
   (c) supplying a reactive gas to the plurality of substrates.

2. The method of claim 1, wherein the source gas is supplied in (b) through a plurality of supply ports of the first nozzle and a plurality of supply ports of the second nozzle while adjusting a partial pressure balance of the source gas to follow a predetermined partial pressure balance along the stacking direction of the plurality of substrates, and
   wherein an opening area of each of the plurality of supply ports of the first nozzle increases along an upward direction from the lower portion to the upper portion of the first nozzle, and an opening area of each of the plurality of supply ports of the second nozzle increases along a downward direction from the upper portion to the lower portion of the second nozzle.

3. A non-transitory computer-readable recording medium storing a program that causes, by a computer, a substrate processing apparatus to perform:
   (a) stacking and accommodating a plurality of substrates in a process chamber of the substrate processing apparatus;
   (b) simultaneously performing: (i) supplying a source gas to the plurality of substrates through a first nozzle provided in the process chamber along a stacking direction of the plurality of substrates such that an amount of the source gas supplied through an upper portion of the first nozzle is greater than that of the source gas supplied through a lower portion of the first nozzle; and (ii) supplying the source gas to the plurality of substrates through a second nozzle provided in the process chamber along the stacking direction of the plurality of substrates such that an amount of the source gas supplied through a lower portion of the second nozzle is greater than that of the source gas supplied through an upper portion of the second nozzle; and
   (c) supplying a reactive gas to the plurality of substrates.

4. The non-transitory computer-readable recording medium of claim 3, wherein the source gas is supplied in (b) through a plurality of supply ports of the first nozzle and a plurality of supply ports of the second nozzle while adjusting a partial pressure balance of the source gas to follow a predetermined partial pressure balance along the stacking direction of the plurality of substrates, and an opening area of each of the plurality of supply ports of the first nozzle increases along an upward direction from the lower portion to the upper portion of the first nozzle, and an opening area of each of the plurality of supply ports of the second nozzle increases along a downward direction from the upper portion to the lower portion of the second nozzle.

5. A method of manufacturing a semiconductor device comprising the method of claim 1.

6. The method of claim 1, wherein, in (c), the reactive gas is supplied to the plurality of substrates through: (i) a third nozzle provided in the process chamber along the stacking direction of the plurality of substrates and configured such that an amount of the reactive gas supplied through an upper portion of the third nozzle is greater than that of the reactive gas supplied through a lower portion of the third nozzle; and (ii) a fourth nozzle provided in the process chamber along the stacking direction of the plurality of substrates and configured such that an amount of the reactive gas supplied through a lower portion of the fourth nozzle is greater than that of the reactive gas supplied through an upper portion of the fourth nozzle.

7. The method of claim 6, wherein the reactive gas is supplied in (c) through a plurality of supply ports of the third nozzle and a plurality of supply ports of the fourth nozzle while adjusting a partial pressure balance of the reactive gas to follow a predetermined partial pressure balance along the stacking direction of the plurality of substrates, and wherein an opening area of each of the plurality of supply ports of the third nozzle increases along an upward direction from the lower portion to the upper portion of the third nozzle, and an opening area of each of the plurality of supply ports of the fourth nozzle increases along a downward direction from the upper portion to the lower portion of the fourth nozzle.

8. The non-transitory computer-readable recording medium of claim 3, wherein, in (c), the reactive gas is supplied to the plurality of substrates through: (i) a third nozzle provided in the process chamber along the stacking direction of the plurality of substrates and configured such that an amount of the reactive gas supplied through an upper portion of the third nozzle is greater than that of the reactive gas supplied through a lower portion of the third nozzle; and (ii) a fourth nozzle provided in the process chamber along the stacking direction of the plurality of substrates and configured such that an amount of the reactive gas supplied through a lower portion of the fourth nozzle is greater than that of the reactive gas supplied through an upper portion of the fourth nozzle.

9. The non-transitory computer-readable recording medium of claim 8, wherein the reactive gas is supplied in (c) through a plurality of supply ports of the third nozzle and a plurality of supply ports of the fourth nozzle while adjusting a partial pressure balance of the reactive gas to a predetermined partial pressure balance along the stacking direction of the plurality of substrates, and an opening area of each of the plurality of supply ports of the third nozzle increases along an upward direction from the lower portion to the upper portion of the third nozzle, and an opening area of each of the plurality of supply ports of the fourth nozzle increases along a downward direction from the upper portion to the lower portion of fourth nozzle.

10. The method of claim 1, wherein in (b), a supply amount of the source gas supplied through both of the first nozzle and the second nozzle to an upper region of the process chamber is greater than that of the source gas supplied through both of the first nozzle and the second nozzle to a lower region of the process chamber.

11. The method of claim 1, wherein in (b), a supply amount of the source gas supplied through both of the first nozzle and the second nozzle to an upper region of the process chamber is the same as that of the source gas supplied through both of the first nozzle and the second nozzle to a lower region of the process chamber.

12. The method of claim 1, wherein in (b), a supply amount of the source gas supplied through both of the first nozzle and the second nozzle to a lower region of the process chamber is greater than that of the source gas supplied through both of the first nozzle and the second nozzle to an upper region of the process chamber.

* * * * *